US010212983B2

(12) United States Patent
Knight

(10) Patent No.: US 10,212,983 B2
(45) Date of Patent: Feb. 26, 2019

(54) SYSTEMS AND METHODS FOR CUSTOMIZED HELMET LAYERS

(71) Applicant: Brainguard Technologies, Inc., El Cerrito, CA (US)

(72) Inventor: Robert T. Knight, El Cerrito, CA (US)

(73) Assignee: Brainguard Technologies, Inc., El Cerrito, CA (US)

( * ) Notice: Subject to any disclaimer, the term of this patent is extended or adjusted under 35 U.S.C. 154(b) by 9 days.

(21) Appl. No.: 15/282,960

(22) Filed: Sep. 30, 2016

(65) Prior Publication Data

US 2018/0092428 A1   Apr. 5, 2018

(51) Int. Cl.
*A42C 2/00* (2006.01)
*A42B 3/06* (2006.01)
*G06F 17/50* (2006.01)
*A42C 1/00* (2006.01)

(52) U.S. Cl.
CPC .............. *A42C 2/007* (2013.01); *A42B 3/064* (2013.01); *A42C 2/002* (2013.01); *G06F 17/50* (2013.01)

(58) Field of Classification Search
CPC .. A41D 13/015; A61B 5/0006; A61B 5/0476; A61B 5/6803; A42C 2/007; A42B 3/064; A42B 3/04; A42B 3/121; A42B 3/125; A42B 3/063; A42B 3/12; A42B 3/10
See application file for complete search history.

(56) References Cited

U.S. PATENT DOCUMENTS

| 8,863,319 | B2* | 10/2014 | Knight | A42B 3/064 2/411 |
|---|---|---|---|---|
| 9,060,561 | B2* | 6/2015 | Knight | A42B 3/064 |
| 9,095,179 | B2* | 8/2015 | Kwan | A41D 13/015 |
| 9,271,536 | B2* | 3/2016 | Knight | A42B 3/064 |
| 9,289,021 | B2* | 3/2016 | Kwan | A41D 13/015 |
| 9,289,022 | B2* | 3/2016 | Knight | A42B 3/064 |
| 9,414,635 | B2* | 8/2016 | Knight | A42B 3/064 |
| 9,516,909 | B2* | 12/2016 | Knight | A42B 3/064 |
| 9,521,874 | B2* | 12/2016 | Knight | A42B 3/064 |
| 9,591,883 | B2* | 3/2017 | Kwan | A41D 13/015 |
| 9,723,889 | B2* | 8/2017 | Knight | A42B 3/064 |
| 9,750,296 | B2* | 9/2017 | Knight | A42B 3/064 |
| 2004/0157527 | A1* | 8/2004 | Omar | G05B 19/4207 446/268 |
| 2006/0019099 | A1* | 1/2006 | Wang | B29C 45/14811 428/412 |

(Continued)

*Primary Examiner* — Robert H Muromoto, Jr.
(74) *Attorney, Agent, or Firm* — Kwan & Olynick LLP

(57) ABSTRACT

Aspects of the present disclosure provide a helmet including customized helmet layers and corresponding methods of construction. In one aspect, a method comprises capturing a 3D image of a head corresponding to the head of an individual, and rendering a 3D headform based on the 3D image. A lining layer is formed, which includes a geometry corresponding to the 3D headform and the inner surface of the shell layer such that an inner surface of the lining layer conforms to the shape of a corresponding portion of the 3D headform. An outer surface of the lining layer further conforms to the shape of a corresponding portion of an inner surface of a shell layer. Another aspect of the method comprises forming a shell layer such that the shell layer includes a geometry corresponding to the shape of a portion of the 3D headform.

16 Claims, 16 Drawing Sheets

(56) References Cited

U.S. PATENT DOCUMENTS

| | | | | |
|---|---|---|---|---|
| 2013/0019384 A1* | 1/2013 | Knight | ............... | A42B 3/064 2/411 |
| 2013/0019385 A1* | 1/2013 | Knight | ............... | A42B 3/064 2/411 |
| 2014/0051044 A1* | 2/2014 | Badower | ............... | A61B 5/00 434/236 |
| 2014/0051961 A1* | 2/2014 | Badower | ............... | A61B 5/00 600/383 |
| 2014/0109299 A1* | 4/2014 | Kwan | ............... | A41D 13/015 2/413 |
| 2015/0000014 A1* | 1/2015 | Knight | ............... | A42B 3/064 2/413 |
| 2015/0141789 A1* | 5/2015 | Knight | ............... | A61B 5/00 600/383 |
| 2015/0245681 A1* | 9/2015 | Knight | ............... | A42B 3/064 2/412 |
| 2015/0305424 A1* | 10/2015 | Kwan | ............... | A41D 13/015 2/411 |
| 2016/0081416 A1* | 3/2016 | Knight | ............... | A42B 3/064 2/412 |
| 2016/0165993 A1* | 6/2016 | Knight | ............... | A42B 3/064 2/411 |
| 2016/0165994 A1* | 6/2016 | Knight | ............... | A42B 3/064 2/412 |
| 2016/0165995 A1* | 6/2016 | Knight | ............... | A42B 3/064 2/412 |
| 2016/0176109 A1* | 6/2016 | Farmer | ............... | B29C 67/0055 264/171.1 |
| 2016/0270469 A1* | 9/2016 | Kwan | ............... | A41D 13/015 |
| 2016/0309828 A1* | 10/2016 | Knight | ............... | A42B 3/064 |
| 2017/0055621 A1* | 3/2017 | Knight | ............... | A42B 3/064 |
| 2017/0280809 A1* | 10/2017 | Knight | ............... | A42B 3/064 |

\* cited by examiner

SYSTEMS AND METHODS FOR CUSTOMIZED HELMET LAYERS

TECHNICAL FIELD

The present disclosure relates to biomechanics aware protective gear.

DESCRIPTION OF RELATED ART

Protective gear such as sports and safety helmets are designed to reduce direct impact forces that can mechanically damage an area of contact. Protective gear will typically include padding and a protective shell to reduce the risk of physical head injury. Liners are provided beneath a hardened exterior shell to reduce violent deceleration of the head in a smooth uniform manner and in an extremely short distance, as liner thickness is typically limited based on helmet size considerations. Such liners are also poorly customized for individual head shapes. Generally, standard liners are used in helmets which can cause gaps or increased pressure areas to form when used by individuals with varying head shapes. In addition to discomfort, improper fitting helmets may also result in decreased injury prevention.

Protective gear is reasonably effective in preventing injury. Nonetheless, the effectiveness of protective gear remains limited. Consequently, various mechanisms are provided to improve protective gear in a biomechanically aware manner.

SUMMARY

The following presents a simplified summary of the disclosure in order to provide a basic understanding of certain embodiments of the present disclosure. Provided are examples of mechanisms and processes relating to constructing customized helmet layers.

In one aspect, which may include at least a portion of the subject matter of any of the preceding and/or following examples and aspects, a method comprises capturing a 3D image of a head corresponding to the head of an individual. The method further comprises rendering a 3D headform based on the 3D image. Rendering the 3D headform may include modeling the 3D headform to remove or flatten hair.

The method further comprises forming a lining layer including a geometry corresponding to the 3D headform and the inner surface of the shell layer such that an inner surface of the lining layer conforms to the shape of a corresponding portion of the 3D headform. The lining layer is further formed such that an outer surface of the lining layer conforms to the shape of a corresponding portion of an inner surface of a shell layer. In some aspects, forming the lining layer may comprise an injection molding process. In some aspects, forming the lining layer may comprise an additive manufacturing process.

In another aspect, a method comprises capturing a 3D image of a head corresponding to the head of an individual. The method further comprises rendering a 3D headform based on the 3D image. The method further comprises forming a first shell layer such that the first shell layer includes a geometry corresponding to the shape of a portion of the 3D headform. In some aspects, forming the first shell layer may comprise an injection molding process. In some aspects, forming the first shell layer may comprise an additive manufacturing process. The first shell layer may be formed from a thermoplastic composite material and/or fiber reinforced composite material.

The method may further comprise imposing a lining layer onto the 3D headform such that an inner surface of the lining layer surrounds a portion of the 3D headform. The geometry of the first shell layer may be based on an outer surface of the lining layer. The method may further comprise forming a second shell layer such that the second shell layer includes a geometry corresponding to the shape of a portion of an outer surface of the first shell layer.

Other implementations of this disclosure include corresponding devices and/or systems constructed by the described method. For instance, in another aspect, a helmet is provided comprising a first shell layer and a lining layer coupled to the interior of the first shell layer. The lining layer may be constructed by capturing a 3D image of a head corresponding to the head of an individual, and rendering a 3D headform based on the 3D image.

The lining layer may be further constructed by forming a lining layer including a geometry corresponding to the 3D headform and the inner surface of the shell layer such that an inner surface of the lining layer conforms to the shape of a corresponding portion of the 3D headform. The lining layer is further formed such that an outer surface of the lining layer conforms to the shape of a corresponding portion of an inner surface of a shell layer.

In some aspects of the helmet, an inner surface of the first shell layer includes a geometry corresponding to the shape of a portion of an outer surface of the lining layer. In some aspects, the helmet further comprises a second shell layer coupled to the first shell layer. An inner surface of the second shell layer may include a geometry corresponding to the shape of a portion of an outer surface of the first shell layer. The second shell layer may be coupled to the first shell layer through a shear mechanism allowing the second shell layer to slide relative to the first shell layer. The shear mechanism includes an energy transformer having an absorptive/dissipative material.

BRIEF DESCRIPTION OF THE DRAWINGS

The disclosure may best be understood by reference to the following description taken in conjunction with the accompanying drawings, which illustrate particular embodiments.

DESCRIPTION OF EXAMPLE EMBODIMENTS

Figure 1:
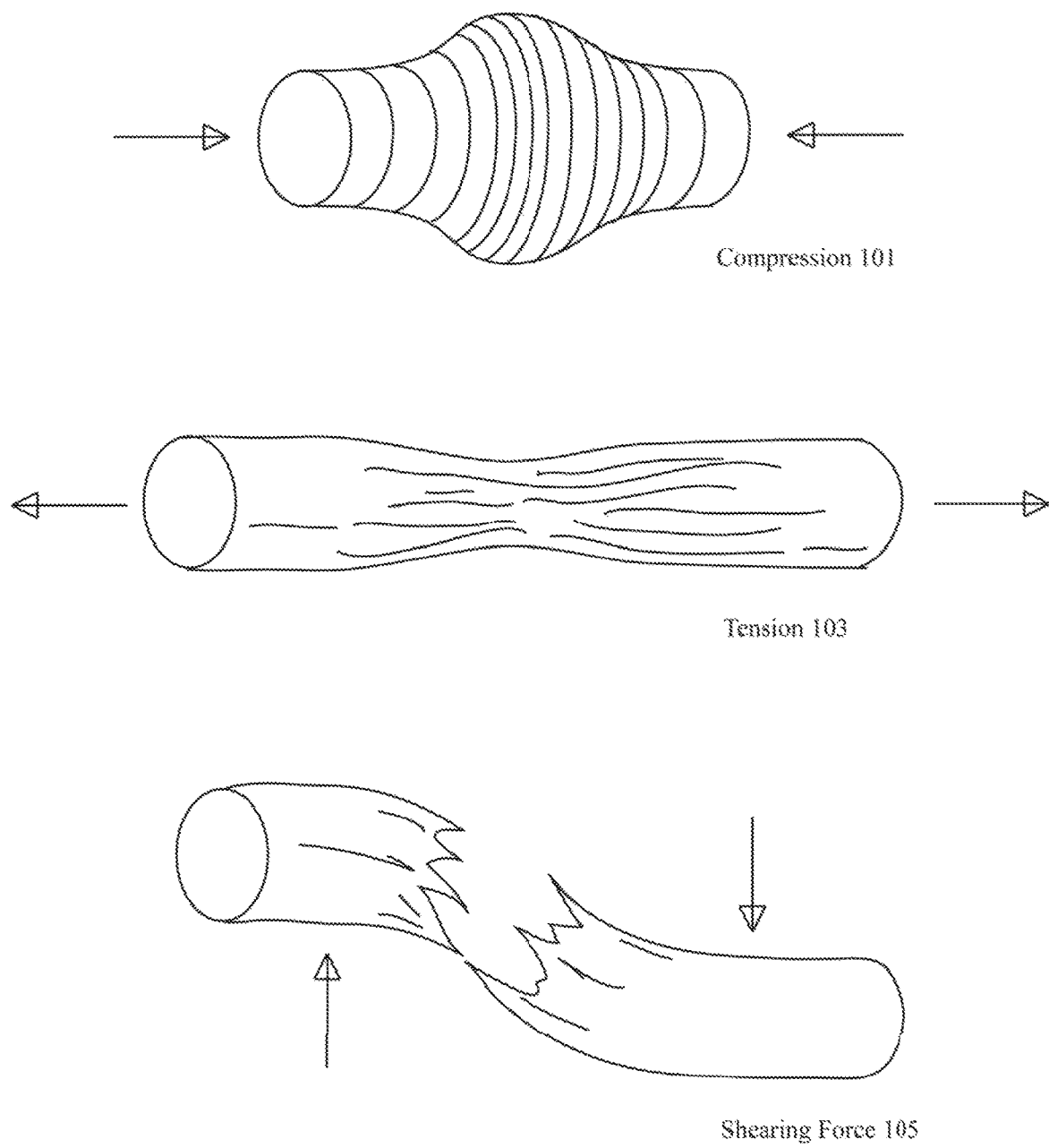
FIG. 1 illustrates types of forces on axonal fibers, in accordance with one or more embodiments.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of helmets. However, it should be noted that the techniques of the present invention apply to a wide variety of different pieces of protective gear. In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. For example, a protective device may use a single strap in a variety of contexts. However, it will be appreciated that a system can use multiple straps while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, different layers may be connected using a variety of materials. Consequently, a connection does not necessarily mean a direct, unimpeded connection unless otherwise noted.

Overview

Protective gear includes an outer shell layer connected to one or more interior shell layers with outer energy and impact transformer layers between each shell layer. The outer and inner energy and impact transformer layers flexibly connect the shell layers to absorb impact forces, rotational forces, shear forces, etc., and allow the various shell layers to move and slide relative to the other shell layers. The energy and impact transformer layers may be constructed using gels, fluids, electro-rheological elements, magneto-rheological elements, etc. The protective gear may be formed as helmets or body protection for various activities and may be used to protect users from not only impact and penetrative forces, but rotational and shear forces as well.

The protective gear further includes a lining layer in between the shell layers and the body. For example, a lining layer would separate the innermost shell layer of a helmet from the head of a user, when worn. The lining layer may be customized to fit a particular user's head. A 3D image of the user's head may be captured and a 3D headform is rendered. The 3D headform may be a digital construction and/or a physical construction. A digital headform may be rendered through various digital applications from data points captured by a 3D image scanner. A physical headform may then be created through injection molding and/or additive manufacturing.

The 3D headform may then be modeled to remove or flatten hair captured in the 3D image and rendered onto the 3D headform. A lining layer may then be formed through injection molding based on the rendered 3D headform. Mold members may be constructed based on the rendered 3D headform. A lining layer may also be formed through additive manufacturing with the data from a digitally rendered headform. Such lining layer may supports a more comfortable and/or secure fit, and may reduce and/or eliminate any gaps and/or high pressured areas existing between users' heads and current lining layers.

A customized shell layers may also be formed based on the rendered and modeled 3D headform. The customized shell layers may be also be formed via injection molding and/or additive manufacturing. In addition to a more comfortable/secure fit, customized shell layers with geometries corresponding to the shape of the user's head can ensure consistent protection around the majority of the user's head. Impact forces may also be more evenly distributed between layers with such corresponding geometries.

Example Embodiments

Protective gear such as knee pads, shoulder pads, and helmets are typically designed to prevent direct impact injuries or trauma. For example, many pieces of protective gear reduce full impact forces that can structurally damage an area of contact such as the skull or knee. Major emphasis is placed on reducing the likelihood of cracking or breaking of bone. However, the larger issue is preventing the tissue and neurological damage caused by rotational forces, shear forces, oscillations, and tension/compression forces.

For head injuries, the major issue is neurological damage caused by oscillations of the brain in the cranial vault resulting in coup-contracoup injuries manifested as direct contusions to the central nervous system (CNS), shear injuries exacerbated by rotational, tension, compression, and/or shear forces resulting in demyelination and tearing of axonal fibers; and subdural or epidural hematomas. Because of the emphasis in reducing the likelihood of cracking or breaking bone, many pieces of protective gear do not sufficiently dampen, transform, dissipate, and/or distribute the rotational, tension, compression, and/or shear forces, but rather focus on absorbing the direct impact forces over a small area, potentially exacerbating the secondary forces on the CNS. Initial mechanical damage results in a secondary cascade of tissue and cellular damage due to increased glutamate release or other trauma induced molecular cascades.

Traumatic brain injury (TBI) has immense personal, societal and economic impact. The Center for Disease Control and Prevention documented 1.4 million cases of TBI in the USA in 2007. This number was based on patients with a loss of consciousness from a TBI resulting in an Emergency Room visit. With increasing public awareness of TBI this number increased to 1.7 million cases in 2010. Of these cases there were 52,000 deaths and 275,000 hospitalizations, with the remaining 1.35 million cases released from the ER. Of these 1.35 million discharged cases at least 150,000 people will have significant residual cognitive and behavioral problems at 1-year post discharge from the ER. Notably, the CDC believes these numbers under represent the problem since many patients do not seek medical evaluation for brief loss of consciousness due to a TBI. These USA numbers are similar to those observed in other developed countries and are likely higher in third-world countries with poorer vehicle and head impact protection. To put the problem in a clearer perspective, the World Health Organization (WHO) anticipates that TBI will become a leading cause of death and disability in the world by the year 2020.

The CDC numbers do not include head injuries from military actions. Traumatic brain injury is widely cited as the "signature injury" of Operation Enduring Freedom and Operation Iraqi Freedom. The nature of warfare conducted in Iraq and Afghanistan is different from that of previous wars and advances in protective gear including helmets as well as improved medical response times allow soldiers to survive events such as head wounds and blast exposures that previously would have proven fatal. The introduction of the Kevlar helmet has drastically reduced field deaths from bullet and shrapnel wounds to the head. However, this increase in survival is paralleled by a dramatic increase in residual brain injury from compression and rotational forces to the brain in TBI survivors. Similar to that observed in the civilian population the residual effects of military deployment related TBI are neurobehavioral symptoms such as cognitive deficits and emotional and somatic complaints. The statistics provided by the military cite an incidence of 6.2% of head injuries in combat zone veterans. One might expect these numbers to hold in other countries.

In addition to the incidence of TBI in civilians from falls and vehicular accidents or military personnel in combat there is increasing awareness that sports-related repetitive forces applied to the head with or without true loss of consciousness can have dire long-term consequences. It has been known since the 1920's that boxing is associated with devastating long-term issues including "dementia pugilistica" and Parkinson-like symptoms (i.e. Mohammed Ali). We now know that this repetitive force on the brain dysfunction extends to many other sports. Football leads the way in concussions with loss of consciousness and post-traumatic memory loss (63% of all concussions in all sports), wrestling comes in second at 10% and soccer has risen to 6% of all sports related TBIs. In the USA 63,000 high school students suffer a TBI per year and many of these students have persistent long-term cognitive and behavioral issues. This disturbing pattern extends to professional sports where impact forces to the body and head are even higher due to the progressive increase in weight and speed of professional athletes. Football has dominated the national discourse in the area but serious and progressive long-term neurological issues are also seen in hockey and soccer players and in any sport with the likelihood of a TBI. Repetitive head injuries result in progressive neurological deterioration with neuropathological findings mimicking Alzheimer's disease. This syndrome with characteristic post-mortem neuropathological findings on increases in Tau proteins and amyloid plaques is referred to as Chronic Traumatic Encephalopathy (CTE).

The human brain is a relatively delicate organ weighing about 3 pounds and having a consistency a little denser than gelatin and close to that of the liver. From an evolutionary perspective, the brain and the protective skull were not designed to withstand significant external forces. Because of this poor impact resistance design, external forces transmitted through the skull to the brain that is composed of over 100 billion cells and up to a trillion connecting fibers results in major neurological problems. These injuries include contusions that directly destroy brain cells and tear the critical connecting fibers necessary to transmit information between brain cells.

Contusion injuries are simply bleeding into the substance of the brain due to direct contact between the brain and the bony ridges of the inside of the skull. Unfortunately, the brain cannot tolerate blood products and the presence of blood kicks off a biological cascade that further damages the brain. Contusions are due to the brain oscillating inside the skull when an external force is applied. These oscillations can include up to three cycles back and forth in the cranial vault and are referred to as coup-contra coup injuries. The coup part of the process is the point of contact of the brain with the skull and the contra-coup is the next point of contact when the brain oscillates and strikes the opposite part of the inside of the skull.

The inside of the skull has a series of sharp bony ridges in the front of the skull and when the brain is banged against these ridges it is mechanically torn resulting in a contusion. These contusion injuries are typically in the front of the brain damaging key regions involved in cognitive and emotional control.

Shear injuries involve tearing of axonal fibers. The brain and its axonal fibers are extremely sensitive to rotational forces. Boxers can withstand hundreds of punches directly in the face but a single round-house punch or upper cut where the force comes in from the side or bottom of the jaw will cause acute rotation of the skull and brain and typically a knock-out. If the rotational forces are severe enough, the result is tearing of axons.

FIG. 1 below shows how different forces affect axons. Compression 101 and tension 103 can remove the protective coating on an axon referred to as a myelin sheath. The myelin can be viewed as the rubber coating on a wire. If the internal wire of the axon is not cut the myelin can re-grow and re-coat the "wire" which can resume axonal function and brain communication. If rotational forces are significant, shear forces 105 tear the axon. This elevates the problem since the ends of cut axons do not re-attach. This results in a permanent neurological deficit and is referred to as diffuse axonal injury (DAI), a major cause of long-term neurological disability after TBI.

Some more modern pieces of protective gear have been introduced with the awareness that significant injuries besides musculoskeletal or flesh injuries in a variety of activities require new protective gear designs.

U.S. Pat. No. 7,076,811 issued to Puchalski describes a helmet with an impact absorbing crumple or shear zone. "The shell consists of three (or more) discrete panels that are physically and firmly coupled together providing rigid protection under most circumstances, but upon impact the panels move relative to one another, but not relative to the user's head, thereby permitting impact forces to be dissipated and/or redirected away from the cranium and brain within. Upon impact to the helmet, there are sequential stages of movement of the panels relative to each other, these movements initially being recoverable, but with sufficient vector forces the helmet undergoes structural changes in a pre-determined fashion, so that the recoverable and permanent movements cumulatively provide a protective 'crumple zone' or 'shear zone'."

U.S. Pat. No. 5,815,846 issued to Calonge describes "An impact resistant helmet assembly having a first material layer coupled to a second material layer so as to define a gas chamber therebetween which contains a quantity that provides impact dampening upon an impact force being applied to the helmet assembly. The helmet assembly further includes a containment layer disposed over the second material layer and structured to define a fluid chamber in which a quantity of fluid is disposed. The fluid includes a generally viscous gel structured to provide some resistance against disbursement from an impacted region of the fluid chamber to non-impacted regions of the fluid chamber, thereby further enhance the impact distribution and dampening of the impact force provided by the helmet assembly."

U.S. Pat. No. 5,956,777 issued to Popovich describes "A helmet for protecting a head by laterally displacing impact forces, said helmet comprising: a rigid inner shell formed as a single unit; a resilient spacing layer disposed outside of and in contact with said inner shell; and an articulated shell having a plurality of discrete rigid segments disposed outside of and in contact with said resilient spacing layer and a plurality of resilient members which couple adjacent ones of said rigid segments to one another."

U.S. Pat. No. 6,434,755 issued to Halstead describes a football helmet with liner sections of different thicknesses and densities. The thicker, softer sections would handle less intense impacts, crushing down until the thinner, harder sections take over to prevent bottoming out.

Still other ideas relate to using springs instead of crushable materials to manage the energy of an impact. Springs are typically associated with rebound, and energy stored by the spring is returned to the head. This may help in some instances, but can still cause significant neurological injury. Avoiding energy return to the head is a reason that non-rebounding materials are typically used.

Some of the protective gear mechanisms are not sufficiently biomechanically aware and are not sufficiently customized for particular areas of protection. These protective gear mechanisms also are not sufficiently active at the right time scales to avoid damage. For example, in many instances, materials like gels may only start to convert significant energy into heat after significant energy has been transferred to the brain. Similarly, structural deformation mechanisms may only break and absorb energy after a significant amount of energy has been transferred to the brain.

Current mechanisms are useful for particular circumstances but are limited in their ability to protect against numerous types of neurological damage. Consequently, an improved smart biomechanics aware and energy conscious protective gear mechanism is provided to protect against mechanical damage as well as neurological damage.

According to various embodiments, protective gear such as a helmet includes a container device to provide a structural mechanism for holding an energy and impact transformer. The design of this element could be a part of the smart energy conscious biomechanics aware design for protection. The energy and impact transformer includes a mechanism for the dissipation, transformation, absorption, redirection or force/energy at the right time scales (in some cases as small as a few milliseconds or hundreds of microseconds).

In particular embodiments, the container mechanism provides structure to allow use of an energy and impact transformer. The container mechanism may be two or three shells holding one or more layers of energy and impact transformer materials. That is, a multiple shell structure may have energy and impact transformer materials between adjacent shell layers. The shells may be designed to prevent direct penetration from any intruding or impeding object. In some examples, the outer shell may be associated with mechanisms for impact distribution, energy transformation, force dampening, and shear deflection and transformation. In some examples, the container mechanism can be constructed of materials such as polycarbonate, fiberglass, Kevlar, metal, alloys, combinations of materials, etc.

According to various embodiments, the energy and impact transformer provides a mechanism for the dissipation, transformation, absorption, and redirection of force and energy at the appropriate time scales. The energy and impact transformer may include a variety of elements. In some examples, a mechanical transformer element connects multiple shells associated with a container mechanism with mechanical structures or fluids that help transform the impact or shear forces on an outer shell into more benign forces or energy instead of transferring the impact or shear forces onto an inner shell.

In some examples, a mechanical transformer layer is provided between each pair of adjacent shells. The mechanical transform may use a shear truss-like structure connecting an outer shell and an inner shell that dampens any force or impact. In some examples, shear truss structure layers connect an outer shell to a middle shell and the middle shell to an inner shell. According to various embodiments, the middle shell or center shell may slide relative to the inner shell and reduce the movement and/or impact imparted on an outer shell. In particular embodiments, the outer shell may slide up to several centimeters relative to the middle shell. In particular embodiments, the material used for connecting the middle shell to the outer shell or the inner shell could be a material that absorbs/dissipates mechanical energy as thermal energy or transformational energy. The space between the outer shell, the middle shell, and the inner shell can be filled with absorptive/dissipative material such as fluids and gels.

According to various embodiments, the energy and impact transformer may also include an electro-rheological element. Different shells may be separated by an electro-rheological element with electric field dependent viscosity. The element may essentially stay solid most of the time. When there is stress/strain on an outer shell, the electric field is activated so that the viscosity changes depending on the level of stress/strain. Shear forces on an inner shell are reduced to minimize impact transmission.

In particular embodiments, the energy and impact transformer also includes a magneto-rheological element. Various shells may be separated by magneto rheological elements with magnetic field dependent viscosity. The element may essentially stay solid most of the time. When there is stress/strain on an outer shell, the magnetic field is activated so that the viscosity changes depending on the level of stress/strain. Shear forces on an inner shell are reduced to minimize impact transmission.

Electro-rheological and magneto-rheological elements may include smart fluids with properties that change in the presence of electric field or a magnetic field. Some smart fluids undergo changes in viscosity when a magnetic field is applied. For example, a smart fluid may change from a liquid to a gel when magnets line up to create a magnetic field. Smart fluids may react within milliseconds to reduce impact and shear forces between shells.

In other examples, foam and memory foam type elements may be included to absorb and distribute forces. In some examples, foam and memory foam type elements may reside beneath the inner shell. A magnetic suspension element may be used to actively or passively reduce external forces. An inner core and an outer core may be separated by magnets that resist each other, e.g. N-poles opposing each other. The inner and outer cores naturally would want to move apart, but are pulled together by elastic materials. When an outer shell is impact and the magnets are pushed closer, forces between the magnets increase through the air gap.

According to various embodiments, a concentric geodesic dome element includes a series of inner shells, each of which is a truss based geodesic dome, but connected to the outer geodesic through structural or fluidic mechanisms. This allows each geodesic structure to fully distribute its own shock load and transmit it in a uniform manner to the dome underneath. The sequence of geodesic structures and the separation by fluid provides uniform force distribution and/or dissipation that protects the inner most shell from these impacts.

In particular embodiments, a fluid/accordion element would separate an inner shell and an outer shell using an accordion with fluid/gel in between. This would allow shock from the outer core to be transmitted and distributed through the enclosed fluid uniformly while the accordion compresses to accommodate strain. A compressed fluid/piston/spring element could include piston/cylinder like elements with a compressed fluid in between that absorbs the impact energy while increasing the resistance to the applied force. The design could include additional mechanical elements like a spring to absorb/dissipate the energy.

In still other examples, a fiber element involves using a rippled outer shell with texture like that of a coconut. The outer shell may contain dense coconut fiber like elements that separate the inner core from the outer core. The shock can be absorbed by the outer core and the fibrous filling. Other elements may also be included in an inner core structure. In some examples, a thick stretchable gel filled bag wrapped around the inner shell could expand and contract in different areas to instantaneously transfer and distribute forces. The combination of the elasticity of a bag and the viscosity of the gel could provide for cushioning to absorb/dissipate external forces.

According to various embodiments, a container device includes multiple shells such as an outer shell, a middle shell, and an inner shell. The shells may be separated by energy and impact transformer mechanisms. In some examples, the shells and the energy and impact transformer mechanisms can be integrated or a shell can also operate as an energy and impact transformer.

Figure 2:
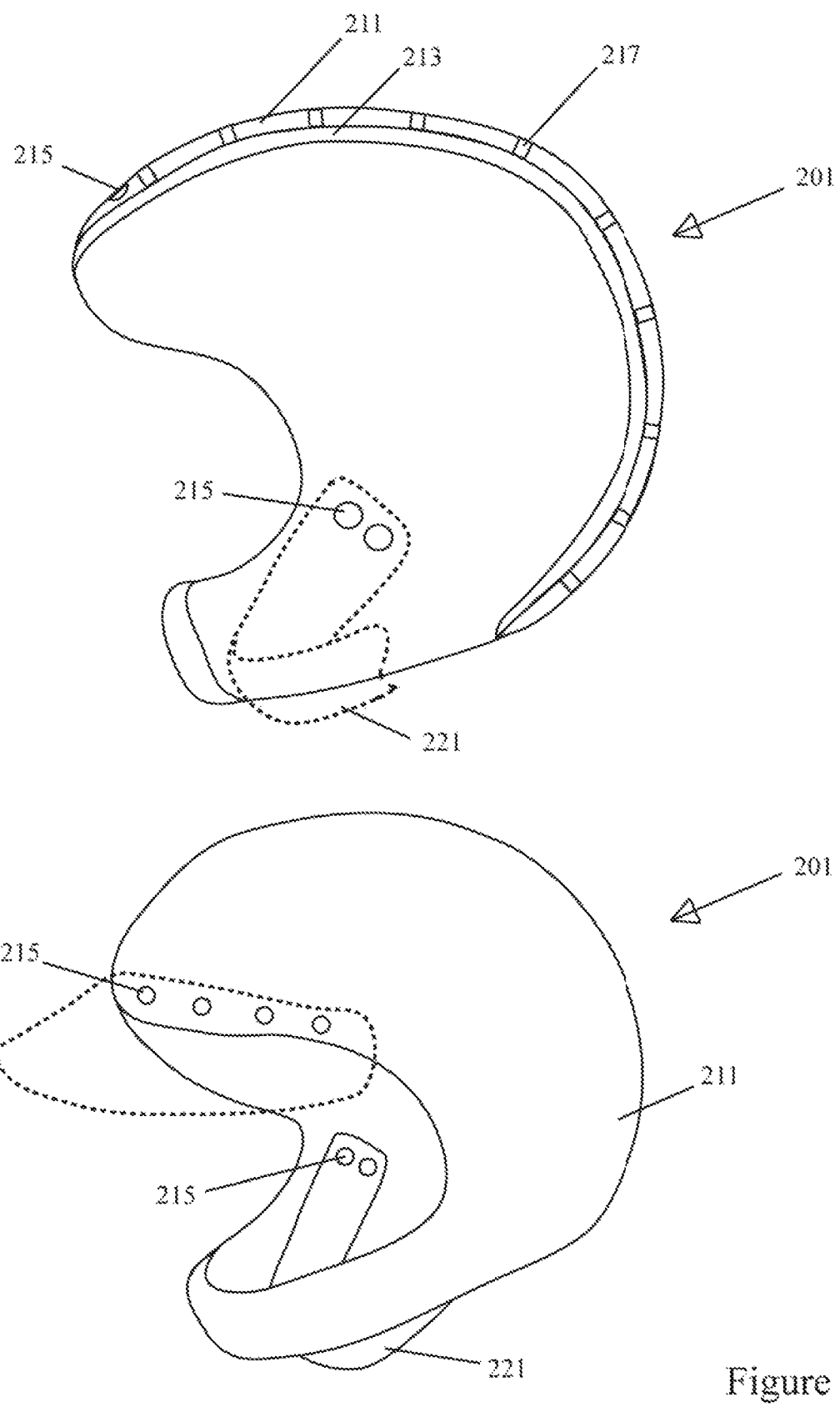
FIG. 2 illustrates one example of a piece of protective gear, in accordance with one or more embodiments.

FIG. 2 illustrates one example of a particular piece of protective gear. Helmet 201 includes a shell layer 211 and a lining layer 213. The shell layer 211 includes attachment points 215 for a visor, chin bar, face guard, face cage, or face protection mechanism generally. In some examples, the shell layer 211 includes ridges 217 and/or air holes for breathability. The shell layer 211 may be constructed using plastics, resins, metal, composites, etc. In some instances, the shell layer 211 may be reinforced using fibers such as aramids. The shell layer 211 helps to distribute mechanical energy and prevent penetration. The shell layer 211 is typically made using lighter weight materials to prevent the helmet itself from causing injury.

According to various embodiments, a chin strap 221 is connected to the helmet to secure helmet positioning. The shell layer 211 is also sometimes referred to as a container or a casing. In many examples, the shell layer 211 covers a lining layer 213. The lining layer 213 may include lining materials, foam, and/or padding to absorb mechanical energy and enhance fit. A lining layer 213 may be connected to the shell layer 211 using a variety of attachment mechanisms such as glue or Velcro. According to various embodiments, the lining layer 213 is pre-molded to allow for enhanced fit and protection. According to various embodiments, the lining layer may vary, e.g. from 4 mm to 40 mm in thickness, depending on the type of activity a helmet is designed for. In some examples, custom foam may be injected into a fitted helmet to allow for personalized fit. In other examples, differently sized shell layers and lining layers may be provided for various activities and head sizes.

The shell layer 211 and lining layer 213 protect the skull nicely and have resulted in a dramatic reduction in skull fractures and bleeding between the skull and the brain (subdural and epidural hematomas). Military helmets use Kevlar to decrease penetrating injuries from bullets, shrapnel etc. Unfortunately, these approaches are not well designed to decrease direct forces and resultant coup-contra coup injuries that result in both contusions and compression-tension axon injuries. Furthermore, many helmets do not protect against rotational forces that are a core cause of a shear injury and resultant long-term neurological disability in civilian and military personnel. Although the introduction of Kevlar in military helmets has decreased mortality from penetrating head injuries, the survivors are often left with debilitating neurological deficits due to contusions and diffuse axonal injury.

Figure 3:
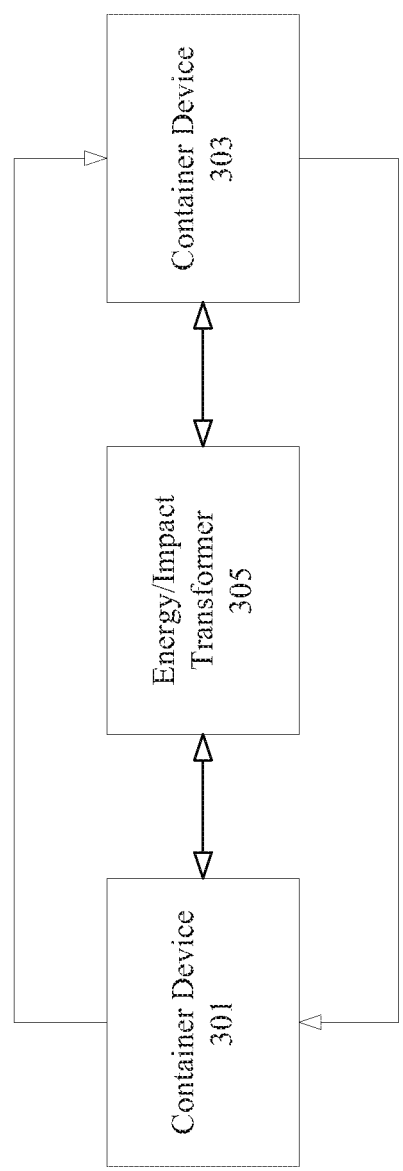
FIG. 3 illustrates one example of a container device system, in accordance with one or more embodiments.

FIG. 3 illustrates one example of a container device system. According to various embodiments, protective gear includes multiple container devices 301 and 303. In particular embodiments, the multiple container devices are loosely interconnected shells holding an energy and impact transformer 305. The multiple container devices may be multiple plastic and/or resin shells. In some examples, the containers devices 301 and 303 may be connected only through the energy and impact transformer 305. In other examples, the container devices 301 and 303 may be loosely connected in a manner supplementing the connection by the energy and impact transformer 305.

According to various embodiments, the energy and impact transformer 305 may use a shear truss-like structure connecting the container 301 and container 303 to dampen any force or impact. In some examples, the energy and impact transformer 305 allows the container 301 to move or slide with respect to container 303. In some examples, up to several centimeters of relative movement is allowed by the energy and impact transformer 305.

In particular embodiments, the energy and impact transformer 305 could be a material that absorbs/dissipates mechanical energy as thermal energy or transformational energy and may include electro-rheological, magneto-rheological, foam, fluid, and/or gel materials.

Figure 4:
FIG. 4 illustrates another example of a container device system, in accordance with one or more embodiments.

FIG. 4 illustrates another example of a container device system. Container 401 encloses energy and impact transformer 403. In some examples, multiple containers or multiple shells may not be necessary. The container may be constructed using plastic and/or resin. And may expand or contract with the application of force. The energy and impact transformer 403 may similarly expand or contract with the application of force. The energy and impact transformer 403 may receive and convert energy from physical impacts on a container 401.

Figure 5:
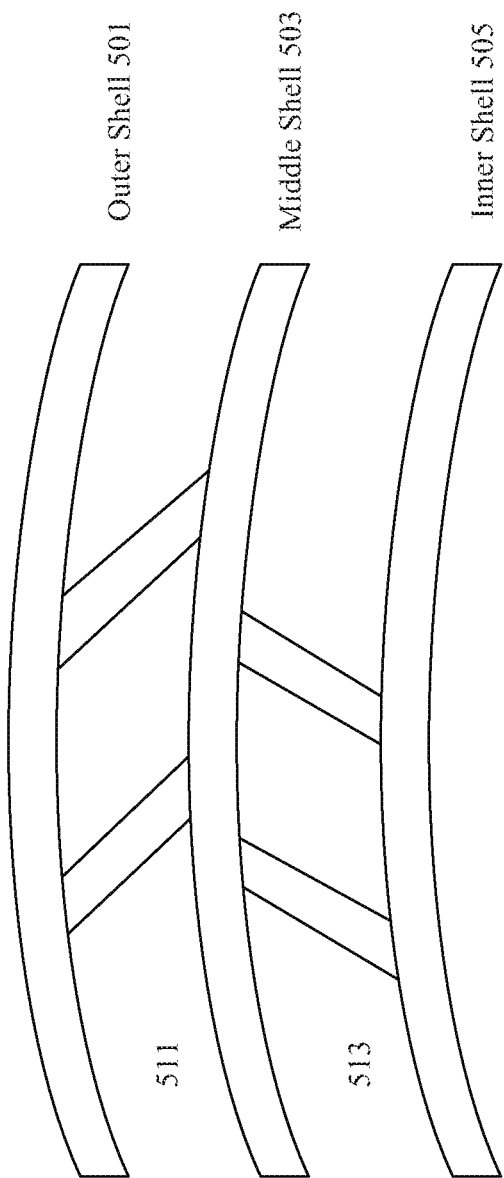
FIG. 5 illustrates one example of a multiple shell system, in accordance with one or more embodiments.

FIG. 5 illustrates one example of a multiple shell system. An outer shell 501, a middle shell 503, and an inner shell 505 may hold energy and impact transformative layers 511 and 513 between them. Energy and impact transformer layer 511 residing between shells 501 and 503 may allow shell 501 to move and/or slide with respect to middle shell 503. By allowing sliding movements that convert potential head rotational forces into heat or transformation energy, shear forces can be significantly reduced.

Similarly, middle shell 503 can move and slide with respect to inner shell 505. In some examples, the amount of movement and/or sliding depends on the viscosity of fluid in the energy and impact transformer layers 511 and 513. The viscosity may change depending on electric field or voltage applied. In some other examples, the amount of movement and/or sliding depends on the materials and structures of materials in the energy and impact transformer layers 511 and 513.

According to various embodiments, when a force is applied to an outer shell 501, energy is transferred to an inner shell 505 through a suspended middle shell 503. The middle shell 503 shears relative to the top shell 501 and inner shell 505. In particular embodiments, the energy and impact transformer layers 511 and 513 may include thin elastomeric trusses between the shells in a comb structure. The energy and impact transformer layers 511 and 513 may also include energy dampening/absorbing fluids or devices.

According to various embodiments, a number of different physical structures can be used to form energy and impact transformer layers 511 and 513. In some examples, energy and impact transformer layer 511 includes a layer of upward or downward facing three dimensional conical structures separating outer shell 501 and middle shell 503. Energy and impact transformer layer 513 includes a layer of upward or downward facing conical structures separating middle shell 503 and inner shell 505. The conical structures in energy and impact transformer layer 511 and the conical structures in energy and impact transformer layer 513 may or may not be aligned. In some examples, the conical structures in layer 511 are misaligned with the conical structures in layer 513 to allow for improved shear force reduction.

In some examples, conical structures are designed to have a particular elastic range where the conical structures will return to the same structure after force applied is removed. The conical structures may also be designed to have a particular plastic range where the conical structure will permanently deform if sufficient rotational or shear force is applied. The deformation itself may dissipate energy but would necessitate replacement or repair of the protective gear.

Figure 6:
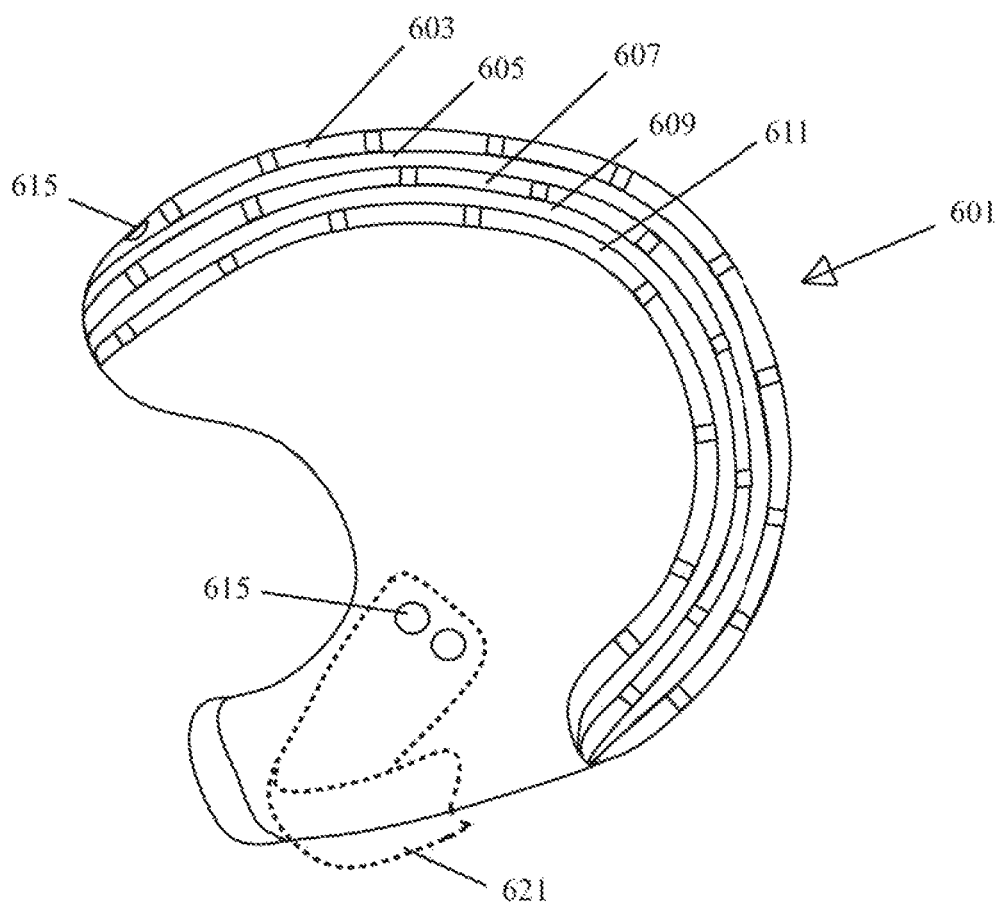
FIG. 6 illustrates one example of a multiple shell helmet, in accordance with one or more embodiments.
Figure 6:
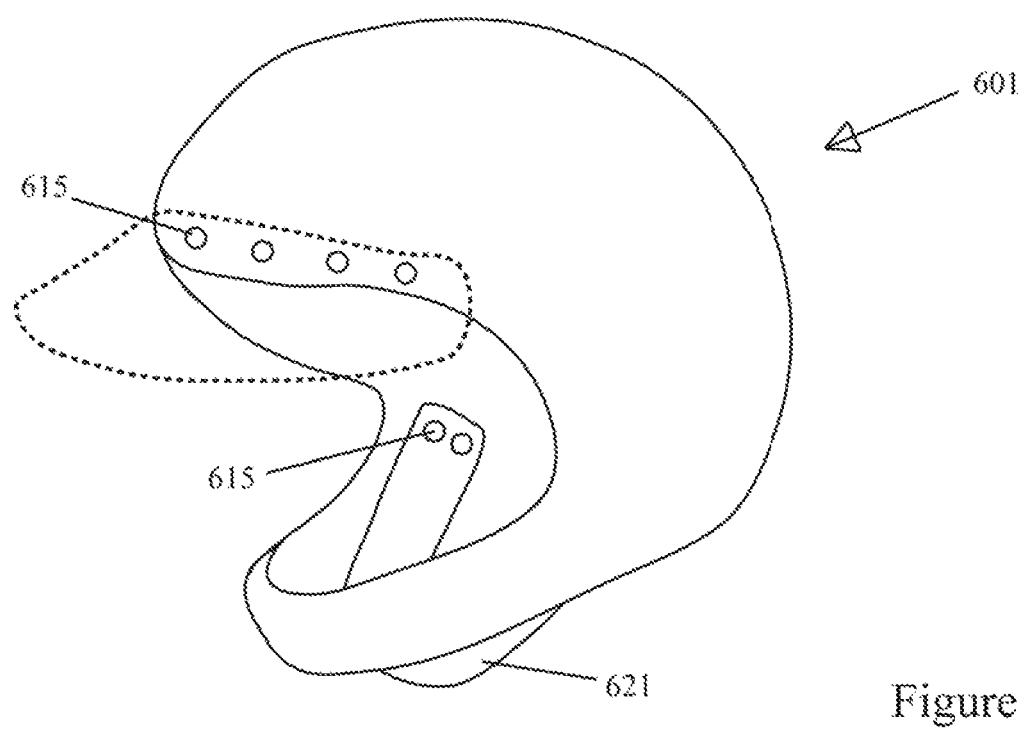

Conical structures are effective in reducing shear, rotational, and impact forces applied to an outer shell 501. Conical structures reduce shear and rotational forces applied from a variety of different directions. According to various embodiments, conical structures in energy and impact transformer layers 511 are directed outwards with bases situated on middle shell 503 and inner shell 505 respectively. In some examples, structures in the energy and impact transformer layer may be variations of conical structures, including three dimensional pyramid structures and three dimensional parabolic structures. In still other examples, the structures may be cylinders, FIG. 6 illustrates one example of a multiple shell helmet. According to various embodiments, helmet 601 includes an outer shell layer 603, an outer energy and impact transformer 605, a middle shell layer 607, an inner energy and impact transformer 609, and an inner shell layer 611. The helmet 601 may also include a lining layer within the inner shell layer 611. In particular embodiments, the inner shell layer 611 includes attachment points 615 for a chin strap for securing helmet 601. In particular embodiments, the outer shell layer 603 includes attachment points for a visor, chin bar, face guard, face cage, and/or face protection mechanism 615 generally. In some examples, the inner shell layer 611, middle shell layer 607, and outer shell layer 603 includes ridges 617 and/or air holes for breathability. The outer shell layer 603, middle shell layer 607, and inner shell layer 611 may be constructed using plastics, resins, metal, composites, etc. In some instances, the outer shell layer 603, middle shell layer 607, and inner shell layer 611 may be reinforced using fibers such as aramids. The energy and impact transformer layers 605 and 609 can help distribute mechanical energy and shear forces so that less energy is imparted on the head.

According to various embodiments, a chin strap 621 is connected to the inner shell layer 611 to secure helmet positioning. The various shell layers are also sometimes referred to as containers or casings. In many examples, the inner shell layer 611 covers a lining layer (not shown). The lining layer may include lining materials, foam, and/or padding to absorb mechanical energy and enhance fit. A lining layer may be connected to the inner shell layer 611 using a variety of attachment mechanisms such as glue or Velcro. According to various embodiments, the lining layer is pre-molded to allow for enhanced fit and protection, as further described below with reference to FIGS. 7A-13. According to various embodiments, the lining layer may vary, e.g. from 4 mm to 40 mm in thickness, depending on the type of activity a helmet is designed for. In some examples, custom foam may be injected into a fitted helmet to allow for personalized fit, as further described below. In other examples, differently sized shell layers and lining layers may be provided for various activities and head sizes.

The middle shell layer 607 may only be indirectly connected to the inner shell layer 611 through energy and impact transformer 609. In particular embodiments, the middle shell layer 607 floats above inner shell layer 611. In other examples, the middle shell layer 607 may be loosely connected to the inner shell layer 611. In the same manner, outer shell layer 603 floats above middle shell layer 607 and may only be connected to the middle shell layer through energy and impact transformer 605. In other examples, the outer shell layer 603 may be loosely and flexibly connected to middle shell layer 607 and inner shell layer 611. The shell layers 603, 607, and 611 provide protection against penetrating forces while energy and impact transformer layers 605 and 609 provide protection against compression forces, shear forces, rotational forces, etc. According to various embodiments, energy and impact transformer layer 605 allows the outer shell 603 to move relative to the middle shell 607 and the energy and impact transformer layer 609 allows the outer shell 603 and the middle shell 607 to move relative to the inner shell 611. Compression, shear, rotation, impact, and/or other forces are absorbed, deflected, dissipated, etc., by the various layers.

According to various embodiments, the skull and brain are not only provided with protection against skull fractures, penetrating injuries, subdural and epidural hematomas, but also provided with some measure of protection against direct forces and resultant coup-contra coup injuries that result in both contusions and compression-tension axon injuries. The skull is also protected against rotational forces that are a core cause of a shear injury and resultant long-term neurological disability in civilian and military personnel.

In some examples, the energy and impact transformer layers 605 and 609 may include passive, semi-active, and active dampers. According to various embodiments, the outer shell 603, middle shell 607, and the inner shell 611 may vary in weight and strength. In some examples, the outer shell 603 has significantly more weight, strength, and structural integrity than the middle shell 607 and the inner shell 611. The outer shell 603 may be used to prevent penetrating forces, and consequently may be constructed using higher strength materials that may be more expensive or heavier.

As previously described, in various embodiments, the lining layer is pre-molded to allow for enhanced fit and protection. In some examples, the lining layer may be custom formed to provide a personalized fit for an individual's head shape. Current lining layers may include foam padding, inflatable bladders, and other lining materials. Such lining layers are the same for each helmet regardless of the shape of the individual's head. This may cause an uneven fit including gaps or high pressured areas between the head and the lining layer and/or the inner shell layer causing discomfort, as well as unwanted movement of the helmet. For example, upon impact, a helmet with an uneven fit may shift and cause the lining layer and/or inner shell layer to further impact the head. Furthermore, such uneven fit may cause an uneven distribution of force upon impact which may result in a larger impact force being focused on a portion of the head.

A more form fitting lining layer may provide an increased comfort in fit eliminating any gaps or pressure points. Furthermore, a more form fitting lining layer may also provide a more secure fit resulting in increased protection by keeping the inner shell layer more stable relative to the head.

Figure 7A:
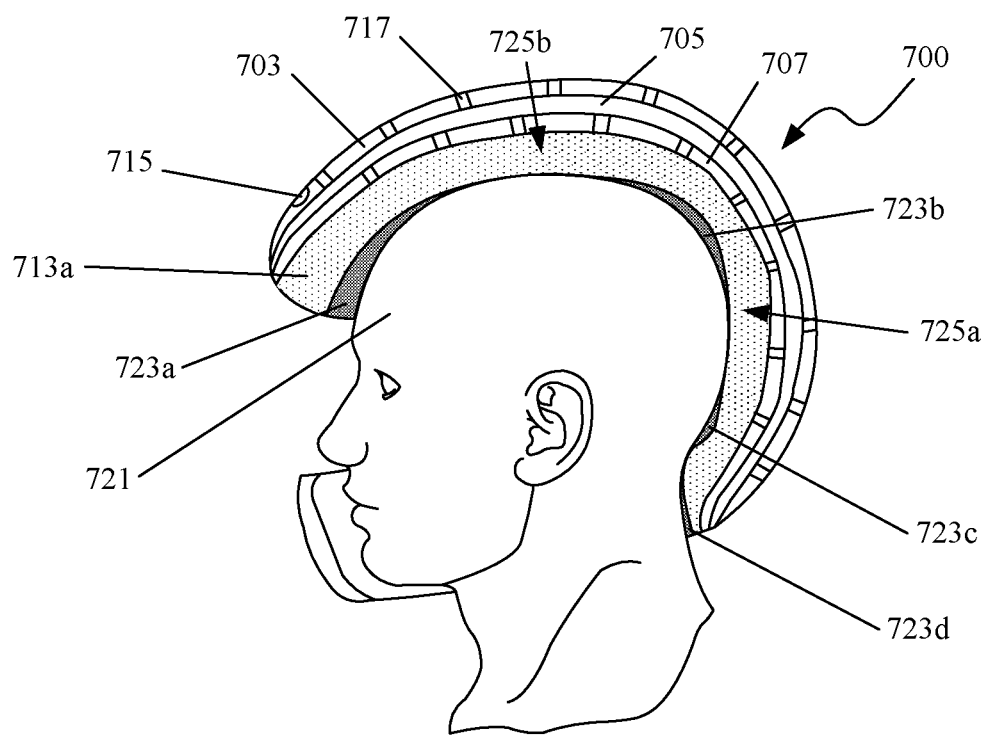
FIG. 7A illustrates an example of a multiple shell helmet with an uncustomized lining layer, in accordance with one or more embodiments.
Figure 7A:
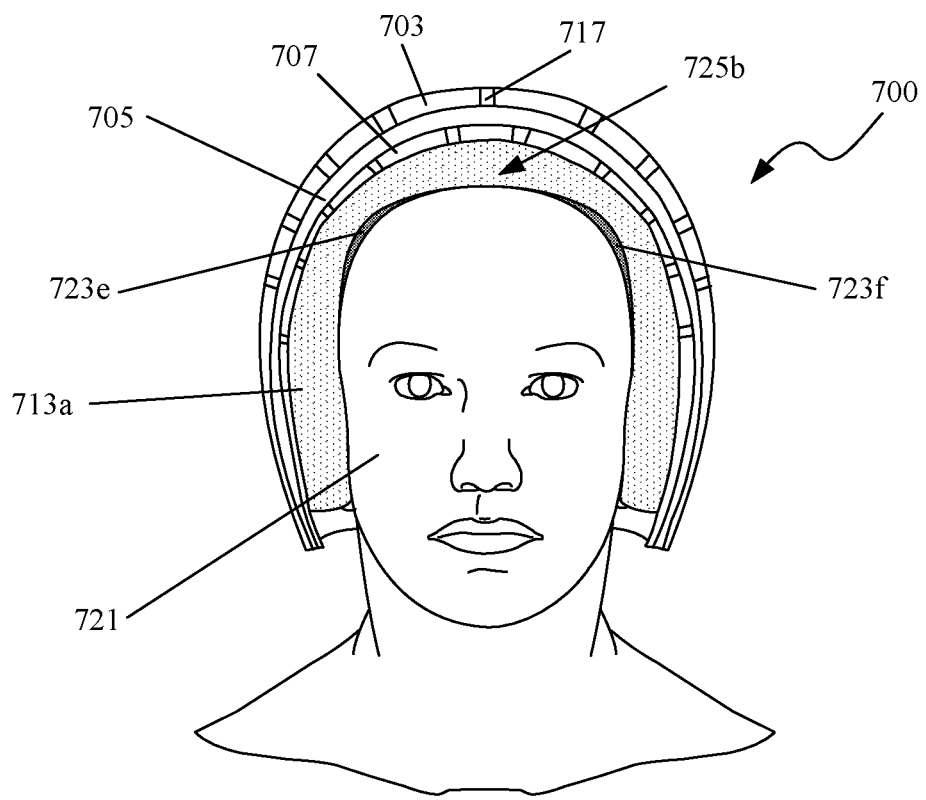
Figure 7B:
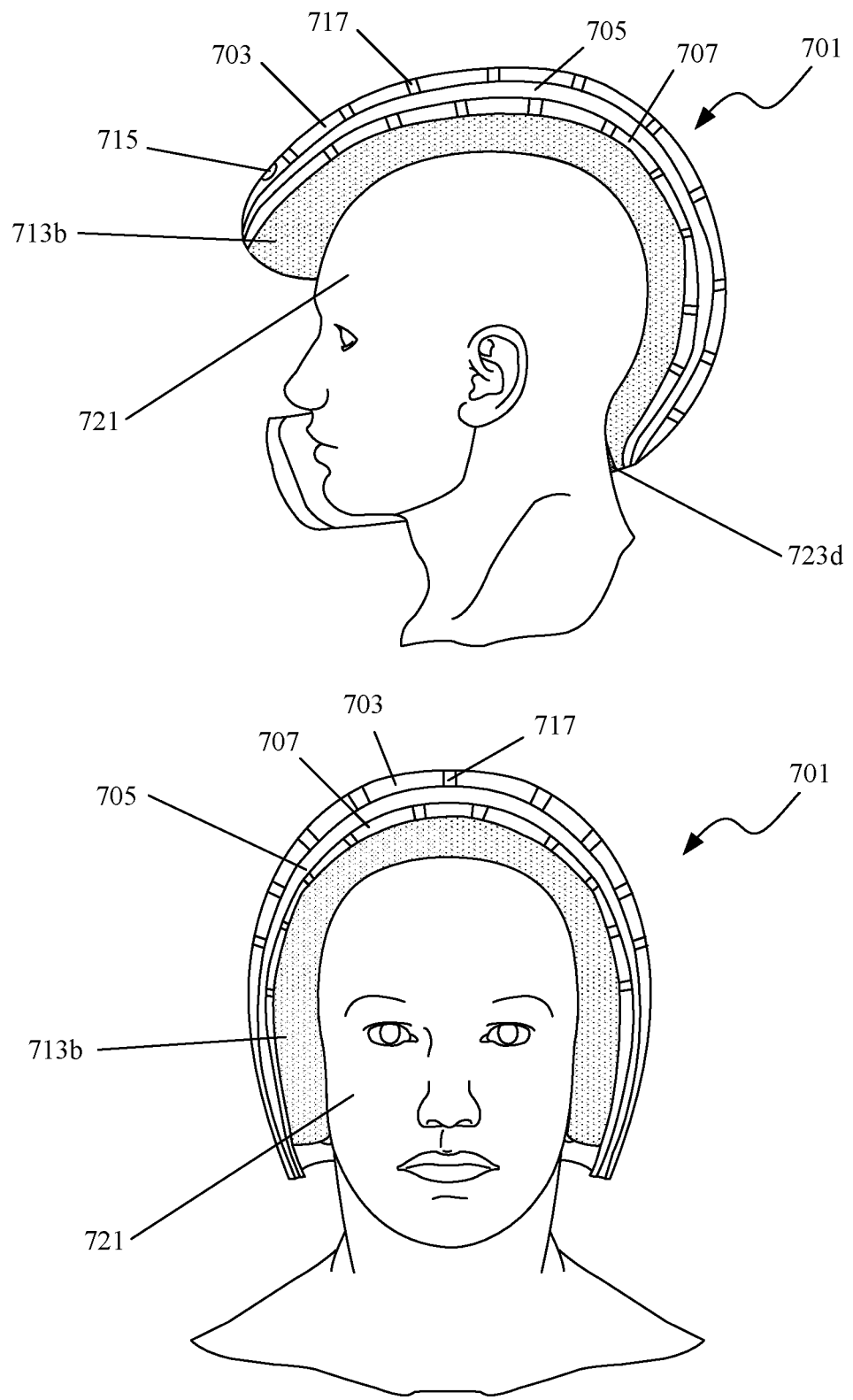
FIG. 7B illustrates an example of a multiple shell helmet with a customized lining layer, in accordance with one or more embodiments.

FIG. 7A illustrates a helmet 700 with a conventional lining layer fitted on a user's head. In some embodiments, helmet 700 may be helmet 201 and/or 601. FIG. 7B illustrates a helmet 701 with a lining layer formed according to one or more embodiments of methods and/or systems the current disclosure. As depicted in FIGS. 7A and 7B, coronal and sagittal cross sections of helmets 700 and 701 are shown around an individual's head 721. Helmets 700 and 701 include an outer shell layer 703, an energy and impact transformer 705, and an inner shell layer 707. In particular embodiments, the outer shell layer 703 includes attachment points for a visor, chin bar, face guard, face cage, and/or face protection mechanism 715 generally. In some examples, the inner shell layer 707 and outer shell layer 703 include ridges 717 and/or air holes for breathability. The outer shell layer 703 and inner shell layer 707 may be constructed using plastics, resins, metal, composites, etc. For example, the outer shell 703 and inner shell 707 may comprise polycarbonate plastic, fiberglass, and/or Kevlar. In some instances, the outer shell layer 703 and inner shell layer 707 may be reinforced using fibers such as aramids. The energy and impact transformer layer 705 may help distribute mechanical energy and shear forces so that less energy is imparted onto the head.

Helmet 700 further includes lining layer 713a. In some embodiments, lining layer 713a comprises one or more pieces that are manufactured according to standard specifications. Such pieces may be constructed from various foam materials such as expanded polystyrene or polypropylene. In other embodiments, other soft padding materials may be used, including memory foam or other polyurethane foams. In some embodiments particular materials may be selected for insulation properties to maintain warmth. In other embodiments, other materials may be included for sweat wicking and quick evaporating properties. In some embodiments, lining layer 713a may also include other fabric or textile materials that cover the lining layer 713a. Lining layer 713a may additionally, and/or alternatively, comprise an inflatable air bladder that can be pumped with air to achieve a desired size. Lining layer 713 is an example of a generic lining layer that is not constructed based on individual head shape and/or size.

In some embodiments, such uncustomized generic lining layer may result in an uneven fit and cause gaps to form between lining layer 713a and head 721, such as gaps 723a, 723b, 723c, 723d, 723e, and 723f. An uneven fit may also cause areas of higher pressure contact between lining layer 713 and head 721, such as high pressure areas 725a and 725b. Gaps and high pressure contact areas may vary depending on individual head shape and/or size in various embodiments, as well as the shape of the helmet and/or lining layers. These gaps and uneven contact areas may reduce impact protection, cause unwanted movement of the helmet, and/or cause discomfort.

In contrast, helmet 701 includes lining layer 713b. Lining layer 713b may be constructed from the same type of materials as lining layer 713a. However, lining layer 713b is a lining layer that is constructed according to customized measurements according to systems and methods disclosed in the present application, and further described below. Lining layer 713b is designed to be custom fitted to an individual head shape and/or size, such as that of head 721. Thus, a majority of gaps and/or high pressure areas are prevented when head 721 is inserted into helmet 701, as shown in FIG. 7B. In some embodiments, one or more gaps and/or high pressure areas may remain. In some embodiments, a helmet including lining layer 713b may comprise only one outer shell layer 703 and no other shell layers.

Figure 8:
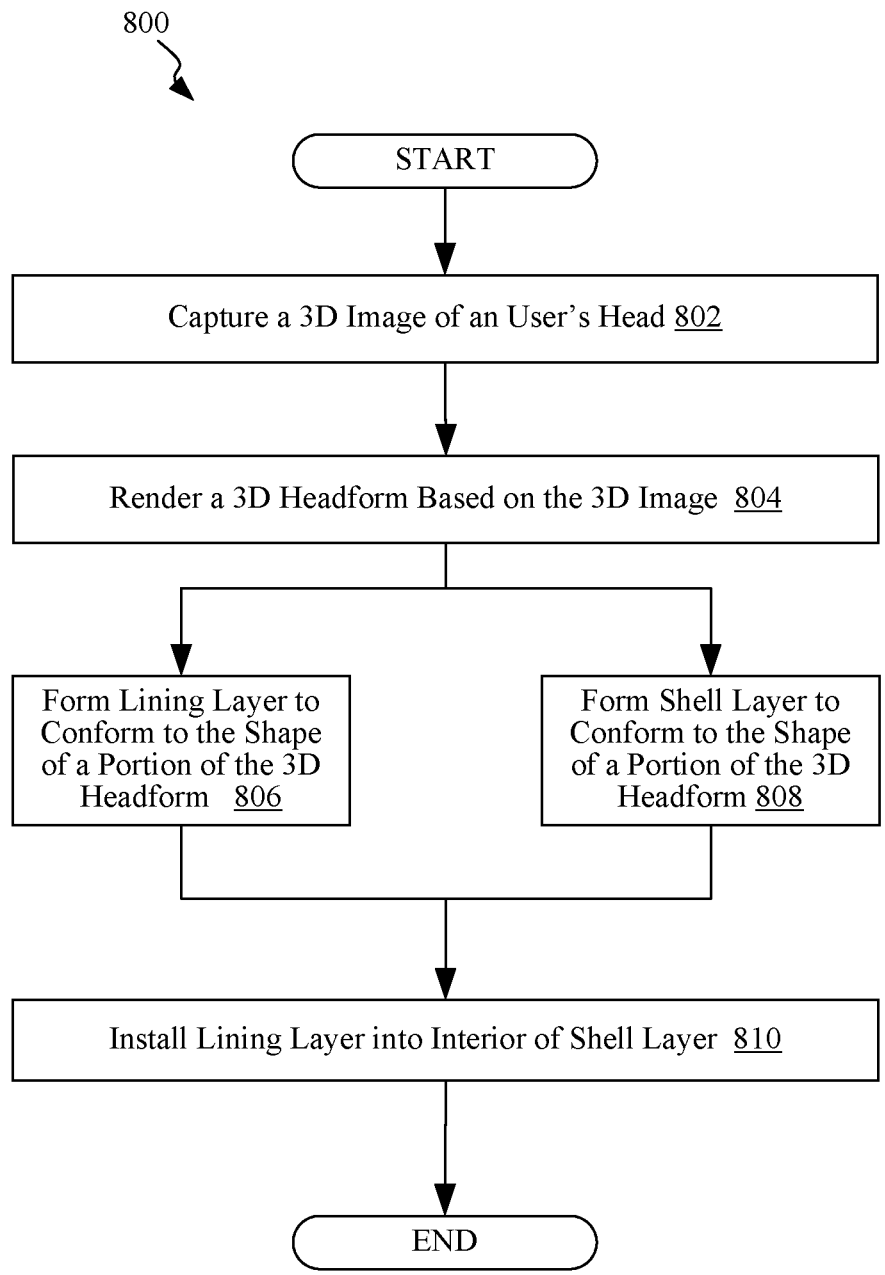
FIG. 8 illustrates a process flowchart corresponding to an example method for constructing a customized helmet lining layer, in accordance with one or more embodiments.

FIG. 8 illustrates a process flowchart corresponding to an example method 800 for constructing a customized helmet lining, in accordance with one or more embodiments. At step 802, a 3D image of a user's head is captured. In some embodiments, the 3D image may be captured by one or more of various types of 3D scanners.

In some embodiments, a non-contact 3D scanner may be implemented to obtain the 3D image. A non-contact active scanner may emit some kind of radiation, such as light, and detect the reflection of the radiation or the radiation passing through the object. For example, a non-contact active scanner may comprise a time-of-light 3D laser scanner which uses laser light to probe the subject by emitting a pulse of light from a laser to a surface of the object (i.e., individual's head) and finding the distance of a surface by timing the round-trip time of a pulse of light. Another example of a non-contact active scanner may be a triangulation based 3D laser scanner. Such triangulation based 3D laser scanners also user laser light to probe the environment. A laser light is shined on the object and uses a camera to determine the location of the laser dot, which may appear at different places in the camera's field of view depending on how far away the laser strikes the surface of the object. In some embodiments, a triangulation based 3D laser scanner may be a hand-held laser scanner.

Another example of a non-contact active scanner may be a conoscopic system which projects a laser beam onto the surface of the object and analyzing the frequency of the diffraction patterns created by through putting the immediate reflection of the laser beam along the same ray-path. In other embodiments, the active non-contact 3D scanner may scan the object by measuring the change in patterns of light projected onto the object, such as a structured light 3D scanner and/or a modulated light 3D scanner.

In other embodiments, a non-contact passive scanner may be implemented. Such passive 3D imaging solutions do not emit any kind of radiation, but rely on detecting reflected ambient radiation, such as visible light and/or infrared. Such passive 3D imaging solutions may include, but are not limited to, stereoscopic and/or photometric systems, as well as silhouette techniques. In some embodiments, a contact 3D scanner, or 3D contact digitizer, may be implemented to obtain the 3D image by probing the head through physical touch. For example, a 3D contact digitizer may fit around an individual's head and extrude probes inward toward the individual's head until each individual probe makes contact with the head. Based on where the probes make contact with the individual's head, data is gathered on the contour of the individual's head geometry. Other techniques may be used in yet further embodiments, including volumetric techniques, such as computed tomography, microtomography, and magnetic resonance imaging. Various embodiments may implement a combination of one or more of the above mentioned 3D scanning techniques.

At step 804, a 3D headform is rendered based on the 3D image capture at step 802. A 3D headform may be rendered as a 3D digital visualization by a computer implemented application. In some embodiments, such digital image may be constructed from data, such as point clouds generated from the data captured by the 3D scanner. In other embodiments, the application may utilize polygonal 3D models, NURBS (non-uniform rational Basis spline) surface models, and/or editable feature-based CAD (computer-aided design) models to visualize the 3D headform.

In some embodiments, rendering the 3D headform further includes constructing a physical 3D model based upon the visualization. Such physical model may be constructed via various additive manufacturing processes, including Binder Jetting, Directed Energy Deposition, Material Extrusion, Material Jetting, Powder Bed Fusion, Sheet Lamination, and/or Vat Photopolymerization. For example, fused deposition modeling may be used to extrude thermoplastic material In some embodiments, the 3D headform comprises at least a portion of the scanned head. In some embodiments, the 3D headform comprises a model of the entire head, including part of the neck and shoulders. In other embodiments, the 3D headform comprises only the relevant portion of the head needed to shape the material. In some embodiments, relevant portion s may include the cheek areas of the face. 3D visualizations and physical models of the 3D headform are further depicted and described with respect to FIGS. 9A and 9B.

Figure 9A:
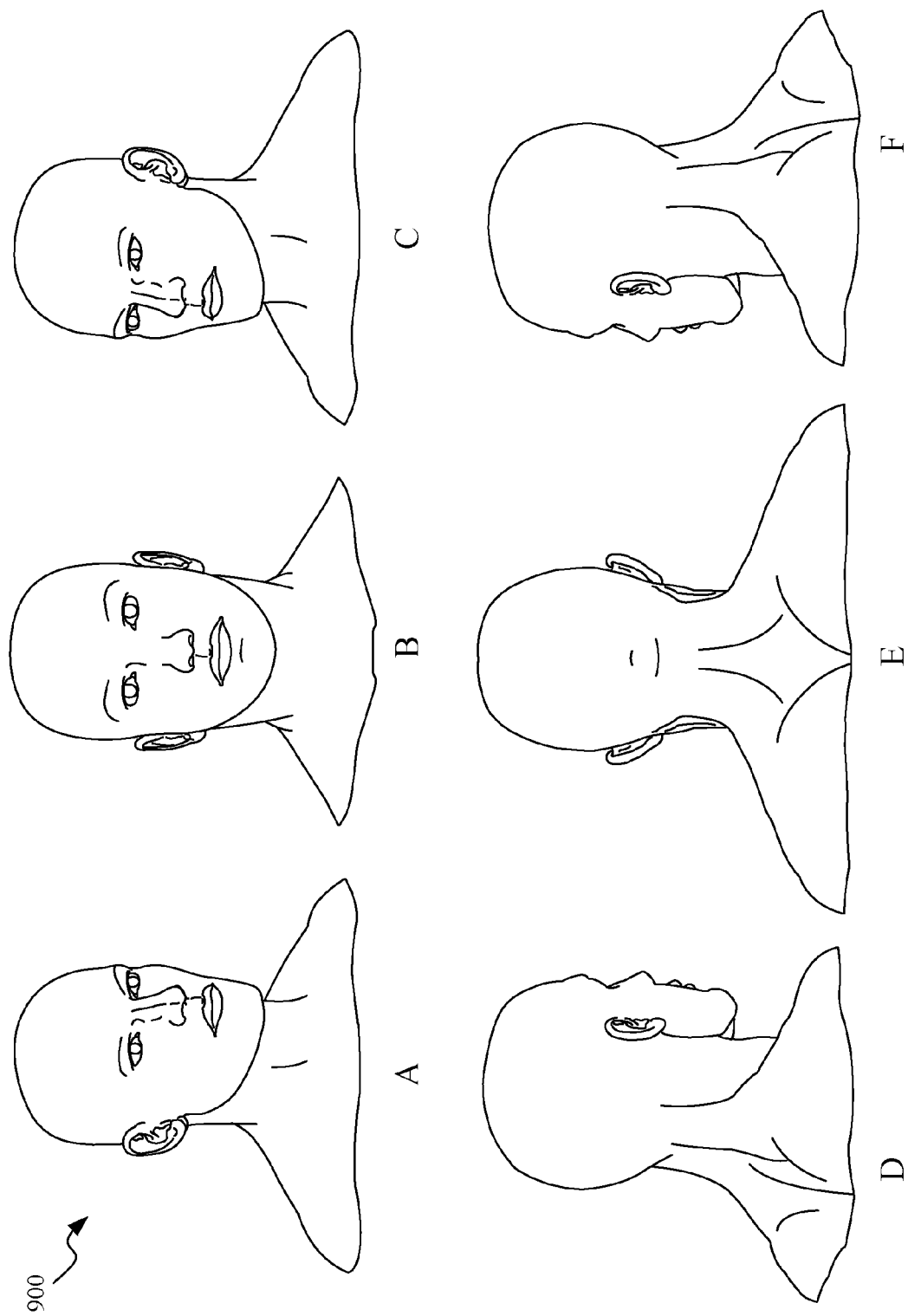
FIGS. 9A and 9B illustrate a rendered 3D headform in accordance with one or more embodiments.
Figure 9B:
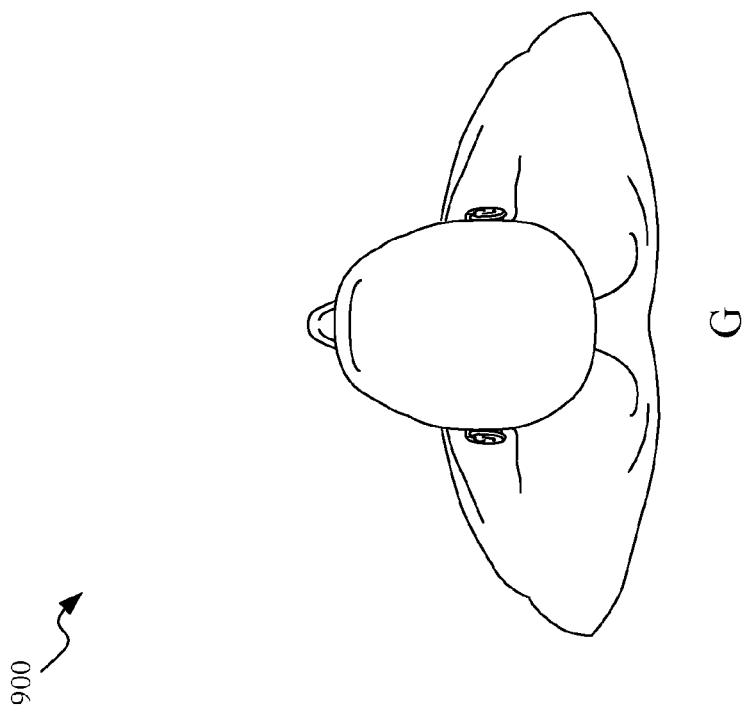
Figure 9B:
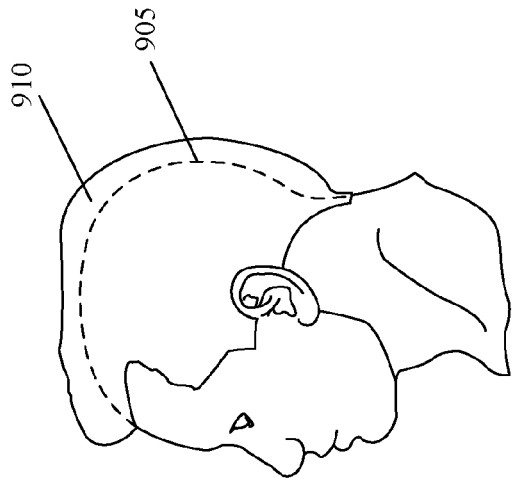
Figure 9B:
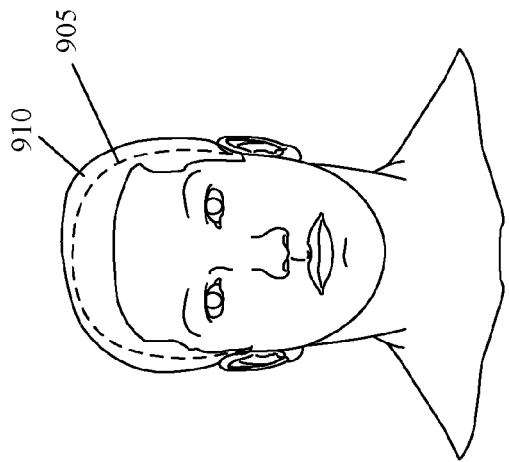

FIGS. 9A and 9B illustrate a rendered 3D headform 900 in accordance with one or more embodiments. FIGS. 9A and 9B depict various views A-G of headform 900. Headform 900 is an example of a 3D headform rendered at step 804. Headform 900 may correspond to the head of an individual, such as head 721, for which a helmet, such as helmet 701 is being customized. As previously described, in some embodiments, headform 900 is a digital rendering of data captured by a 3D scanning device. In some embodiments, the rendering includes facial features and other parts of the body near the head, such as neck and shoulders, as shown in FIGS. 9A and 9B. In some embodiments, a rendered headform 900 may only include the areas of the head that are relevant for determining the construction of the helmet. In some embodiments, the rendering may include various angles around the individual's head. View G in FIG. 9B shows another angle of the rendered headform 900 from a top-down view. Various other angles of head 721 may be captured for use in rendering headform 900.

In some embodiments, rendering the headform 900 at step 804 may further include constructing a physical model. Headform 900 may also represent the physical 3D headform. In some embodiments, the physical headform 900 may be constructed based on the data points of the digital image through sculpting and/or additive manufacturing processes. As with the digital headform, a physical headform 900 may be constructed to only include the areas of the head that are relevant for determining the construction of the helmet.

In some embodiments, 3D scanning of an individual's head will also capture hair on the individual's head. Views H and I in FIG. 9B show a headform 900 including hair 910. In some embodiments, the digital 3D headform 900 and/or physical 3D headform 900 may be modeled to remove and/or flatten the imaged hair 910. This may be done to reveal the underlying geometry 905 of the individual's head, shown with dashed lines in FIG. 9B.

In some embodiments, a digital 3D headform may be modeled by computer extrapolation and predictive imaging. In some embodiments, a digital headform 900 may be manually modeled and/or digitally edited by an operator of the 3D rendering application to approximate the underlying head geometry. A digital head form may also be modeled using computer applications that predict the shape of the user's head geometry. In some embodiments, a contact 3D scanner may be implemented to determine the underlying geometry 905 of the head through contact sensors in contact with the individual's head. Such data points may be combined with the data used to create the digital 3D headform 900 to digitally render the headform 900 without hair. A physical headform 900 may then be constructed based on the hairless digital rendering. In some embodiments, a physical headform 900 may be constructed to include hair that is captured in the 3D imaging process of step 802. The hair 910 may then be removed from the physical 3D headform 900 by cutting, sculpting, sanding, or other means of removing material. Such sculpting may be done manually or by machine.

In some embodiments, it may be desirable to include hair or additional space to accommodate hair. In such embodiments, the headform 900 may be digitally and/or physically constructed to include the scanned hair. In other embodiments, the headform 900 may be digitally and/or physically constructed to include additional layers on top of the underlying head geometry.

A lining layer may then be formed through additive manufacturing processes based on the known shape of headform 900 and a known shape of a corresponding shell layer, such as 707. In some embodiments, a lining layer may be formed through injection molding. In such embodiments, mold members may be constructed through additive manufacturing based on the rendered headform 900. In some embodiments, the constructed physical headform 900 may be used as a mold member in forming the lining layer.

With reference back to FIG. 8, a lining layer is formed to conform to the shape of a portion of the 3D headform at step 806. In some embodiments, the lining layer is lining layer 713b which is conforms to the shape of an individual's head, such as head 721, such that there are no gaps, such as gaps 723a, 723b, 723c, 723d, 723e, and 723f, and/or high pressure contact areas, such as 725a and 725b.

As previously described, in some embodiments, the lining layer may comprise of one or more various foam materials, such as expanded polystyrene or polypropylene, memory foam or other polyurethane foams. Such foam materials may be sculpted to conform to the shape of a portion of the 3D headform. The foam material may further be sculpted to conform to the shape of a portion of the inner surface of a shell layer, such as inner shell 707. Thus, the foam liner may fit between the head and the shell layer when the helmet is place upon the individual's head.

In some embodiments, the lining layer is sculpted by cutting, such as by a foam rubber cutter, various saws, or other cutting devices. In other embodiments, the inner lining may be molded through injection molding. For example, one or more foam materials described above may be injection foam molded. In other embodiments, a thermoplastic material may be used and injected in a molten state into a molding of one or more mold members, and removed once hardened. In some embodiments, the mold members may be shaped based on a portion of the 3D headform. In some embodiments, the 3D headform created at step 804 may be used as a mold member. In some embodiments, other mold members may be shaped based on the interior of the innermost shell layer, such as inner shell 707.

In other embodiments, the lining layer may be constructed through the various additive manufacturing processes previously described. For example, an additive manufacturing system may deposit the foam in a viscous unhardened state. In other embodiments, the lining layer may comprise a thermoplastic material. In some embodiments, the additive manufacturing system receives instructions and data from an application to deposit the lining material to conform to the shape of a portion of the 3D headform and at least a portion of the interior of the innermost shell layer, such as inner shell 707, such that the lining material may fit between the head and the shell layer when the helmet is place upon the individual's head 721. In various embodiments, the lining layer material may be deposited to provide various internal geometries. In some embodiments, such geometries may result in increased flexibility for impact resistance. In some embodiments, such geometries may result in less material usage to decrease weight while maintaining strength, durability, and/or flexibility.

At step 810, the lining layer is installed into the interior of a shell layer. In various embodiments, the helmet may include one or more shell layers, as previously described above. In some embodiments, the customized lining layer is installed into the interior of the innermost shell layer, such as inner shell 707 in helmet 701, such that the lining layer is configured to be the innermost layer in contact with the head when the helmet is worn. In some embodiments, the lining layer is attached to the shell layer by glue, other adhesives, Velcro, or other fastening mechanisms. In some embodiments, the lining layer and the shell layer are attached such that there is no relative movement between the lining layer and the attached shell layer. In some embodiments, the lining layer is covered in some synthetic material.

Step 808 is an optional step that may be implemented in some embodiments instead of, or in addition to, step 806. At step 808 a shell layer is formed to correspond to the shape of a portion of the 3D headform. In some embodiments, the shell layer is constructed such that it is customized to include a geometry that corresponds to the shape of the headform 900 and/or individual head 721 scanned in step 802, instead of, or in addition to, forming a custom lining layer in step 806.

In some embodiments, the 3D headform may be further modeled at step 804 to include a lining layer to determine the shape of the customized shell layer. In some embodiments, a customized lining layer, such as that formed in step 806, may be used. In some embodiments an uncustomized lining layer, which comprises an equal thickness throughout the majority of the lining layer, may be used. Such lining layer may be digitally projected on top of a digital 3D headform rendered at step 804. A physical headform may then be sculpted, such as in step 804, such that the lining layer is included in the 3D headform sculpt. In some such embodiments, modeling of the physical 3D headform to remove and/or flatten hair is not needed.

In embodiments, where a physical 3D headform is constructed, an uncustomized lining layer may be placed on top of the physical sculpt to determine the shape of the customized shell layer. In such embodiments, the physical 3D headform may be modeled to remove and/or flatten hair, as previously described at step 804. In some embodiments, a proxy lining layer may be placed on top of the physical sculpt. Such proxy lining layer may comprise the same and/or similar material as the 3D physical sculpt and comprise the same shape and thickness of the actual uncustomized lining layer.

In some embodiments, the customized shell layer may be constructed from fiberglass and/or plastics, such as polycarbonate plastics or thermoplastic material. In some embodiments, the customized shell layer maybe reinforced with materials, such as Kevlar or carbon fiber, to increase strength and/or prevent penetration by foreign objects. In some embodiments, the shell layer may be constructed from other materials previously described above. In some embodiments, forming the customized shell layer includes injection molding of thermoplastic or other thermo-viscous material. For example, a thermoplastic material may be used and injected in a molten state into a molding of one or more mold members, and removed once hardened. In some embodiments, the mold members may be shaped based on a portion of the 3D headform 900. In some embodiments, the 3D headform 900 created at step 804 may be used as a mold member.

In other embodiments, the customized shell layer is constructed through the various additive manufacturing processes previously described. For example, an additive manufacturing system may extrude a material, such as thermoplastic filament through an extrusion nozzle to be deposited in a particularly determined pattern. In some instances, the thermoplastic material may be a continuous fiber reinforced composite reinforced with carbon fiber or other material. In some embodiments, the instructions for forming a shell layer through additive manufacturing may be digital instructions based on the digital 3D headform 900 generated at step 804. In various embodiments, the shell layer material may be deposited to provide various geometries. In some embodiments, such geometries may result in increased flexibility for impact resistance. In some embodiments, such geometries may result in less material usage to decrease weight while maintaining strength, durability, and/or flexibility. Examples of customized shell layers are further described with reference to FIGS. 10 and 11.

After a customized shell layer is formed at step 808, a lining layer is installed into the customized shell layer at step 810. In some embodiments, the lining layer used in step 812 may be an uncustomized lining layer, of which a majority of the lining layer may include a constant thickness. Similar to the installation of the lining layer in step 808, the uncustomized lining layer is installed into the customized shell layer such that the lining layer is configured to be the innermost layer in contact with the head when the helmet is worn. In some embodiments, the lining layer is attached to the shell layer by glue, other adhesives, Velcro, or other fastening mechanisms. In some embodiments, the lining layer and the shell layer are attached such that there is no relative movement between the lining layer and the attached shell layer.

As previously described, the lining layer may be constructed from various foam materials which may take the form of the customized shell layer when installed within the customized shell, such that it conforms to the shape of the head scanned at step 802 and rendered at step 804. In some embodiments, the lining layer may be 3D printed or injection molded to conform to the shape of head 721 and the inner surface of the customized shell layer. In some embodiments, the mold members for injection molding the lining layer may be constructed based off of the constructed customized shell and/or 3D headform 900. In some embodiments, a customized lining layer, such as a lining layer formed at step 806 may be installed to attach to the interior of the customized shell layer.

In some embodiments, the lining layer is covered in some usually synthetic material. This material can have wicking properties to absorb moisture quickly or spread the moisture over a large area for quick evaporation. In some embodiments, the covering of synthetic material is removable for replacement, maintenance, and/or cleaning out skin oils, road pollutants, sweat and smells.

Figure 10:
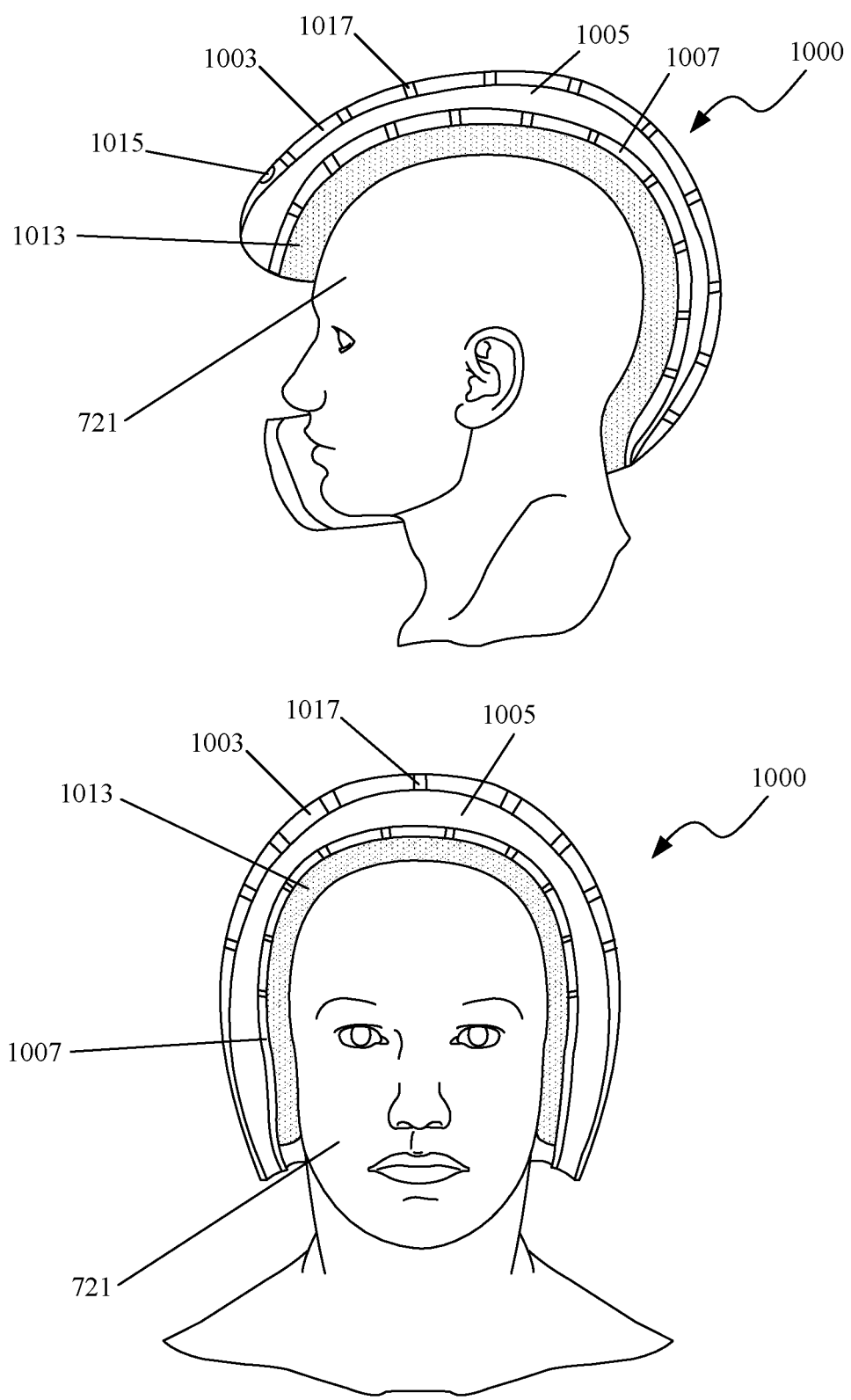
FIG. 10 illustrates a multiple shell helmet with a customized shell layer, in accordance with one or more embodiments.

FIG. 10 illustrates a multiple shell helmet 1000 with a customized shell layer, in accordance with one or more embodiments. FIG. 10 depicts coronal and sagittal cross sections of helmet 1000 around head 721, which includes an inner shell layer 1007 that is constructed to conform to the shape of a portion of the 3D headform and/or individual head 721, as described in step 810. In some embodiments, helmet 1000 may be helmet 701 with modified inner shell layer 1007 and lining layer 1013. Helmet 1000 includes an outer shell layer 1003, energy and impact transformer 1005, and an inner shell layer 1007. In particular embodiments, the outer shell layer 1003 includes attachment points for a visor, chin bar, face guard, face cage, and/or face protection mechanism 1015 generally. In some examples, the inner shell layer 1007 and outer shell layer 1003 include ridges 1017 and/or air holes for breathability. The outer shell layer 1003 and inner shell layer 1007 may be constructed using materials described above, and with reference to FIG. 2 and/or FIG. 6.

As depicted in FIG. 10, helmet 1000 is placed around head 721. In some embodiments, head 721 may represent a physical 3D headform, such as headform 900. Inner shell 1007 is an example of a customized shell layer formed at step 810. Because the shape of inner shell 1007 includes a geometry corresponding to the shape of head 721, a lining layer 1013 of constant thickness may be attached to the interior of inner shell 1007 and take on the same shape corresponding to the shape of head 721. In some embodiments, lining layer 1013 may be a custom lining layer formed at step 806. In some embodiments, having a lining layer 1013 of constant thickness causes impact forces to be distributed more evenly through the lining layer 1013, and subsequently to head 721. In some embodiments, a lining layer 1013 of constant thickness ensures a consistent amount of protection at every point around head 721.

Figure 11:
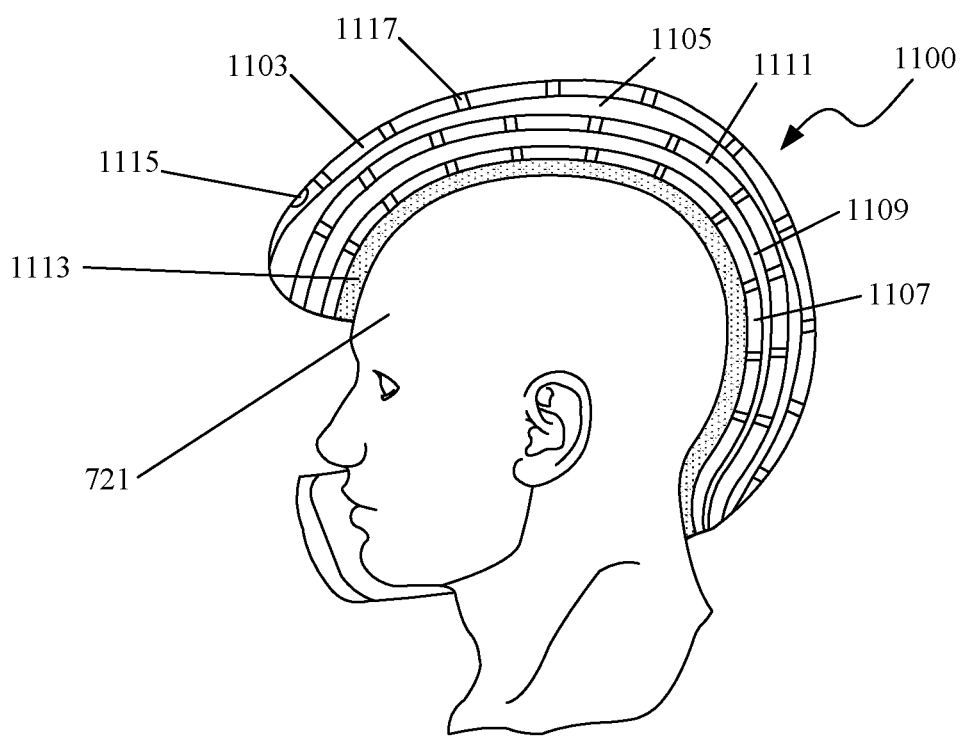
FIG. 11 illustrates a multiple shell helmet with multiple customized shell layers, in accordance with one or more embodiments.
Figure 11:
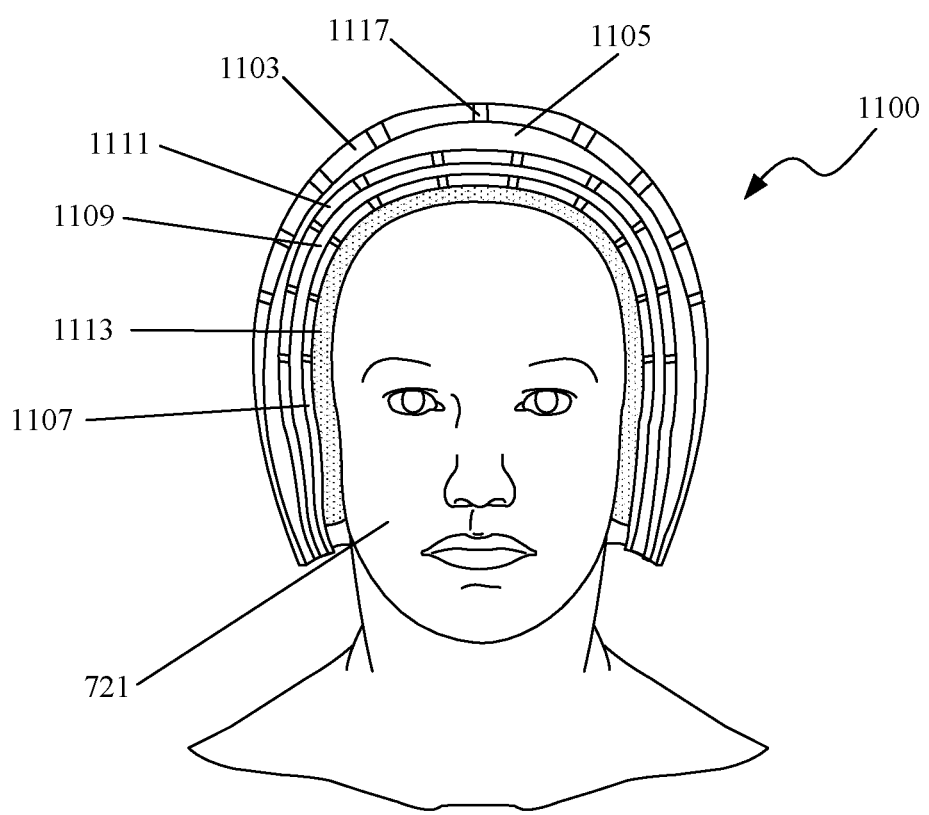

FIG. 11 illustrates another multiple shell helmet 1100 with multiple customized shell layers, in accordance with one or more embodiments. FIG. 11 depicts coronal and sagittal cross sections of helmet 1100 around head 721, which includes an inner shell layer 1107 and a middle shell layer 1111 that are both constructed to include geometries corresponding to the shape of a portion of the 3D headform and/or individual head 721, as described in step 810. In some embodiments, helmet 1100 may be a helmet such as helmet 601. Like helmet 601, helmet 1100 comprises three shell layers, including outer shell layer 1103, outer energy and impact transformer 1105, inner shell layer 1107, inner energy and impact transformer 1109, and middle shell layer 1111 positioned between outer shell layer 1103 and inner shell layer 1107. Helmet 1100 also includes lining layer 1113. In particular embodiments, the outer shell layer 1103 includes attachment points for a visor, chin bar, face guard, face cage, and/or face protection mechanism 1115 generally. In some examples, the inner shell layer 1107, middle shell layer 1111, and outer shell layer 1103 include ridges 1117 and/or air holes for breathability.

In some embodiments, outer shell layer 1103 may be outer shell layer 1003. In some embodiments, inner shell layer 1107 may be inner shell 1007, which is formed at step 810 to include a geometry corresponding to the shape of head 721. Middle shell layer 1111 is also formed to include a geometry corresponding to the shape of head 721. In some embodiments, middle shell layer 1111 is constructed by methods used to construct the inner shell layer 1107, such as described in step 810.

In some embodiments, a shell layer, such as shell layer 1107 or 1111, may comprise an inner surface and an outer surface with different geometries. In other words, the thickness of shell layer 1107 may not be consistent throughout the majority of the layer. For example, the inner surface of shell layer 1107, which is the surface nearer head 721, may include a geometry corresponding to a portion of head 721. Such shell layer 1107 may be designed to include a thicker portion causing the outer surface of shell layer 1107 to include a geometry that doesn't correspond to a portion of head 721. In such embodiments, middle shell layer 1111 may be formed to include a geometry corresponding to the shape of the outer surface of inner shell 1107. For example, the inner surface of middle shell layer 1111 may include such corresponding geometry, while the outer surface of middle shell layer 1111 may include another geometry depending on the shape and thickness design of shell layer 1111. In further embodiments, an outer shell layer, such as outer shell layers 1003 and/or 1103 may also be formed to include a geometry corresponding to the shape of a portion of head 721 and/or corresponding to the shape of a portion of one or more other shell layers.

In some embodiments, two shells with conforming geometries, such as shell layers 1107 and 1111, may cause impact to distribute more evenly between the shell layers, and/or through the energy and impact transformer, such as energy and impact transformer 1109. In some embodiments, additional shell layers may be included, and separated by additional energy and impact transformers. In some embodiments, one or more of these additional shell layers are also formed with corresponding geometries that correspond to the shape of head 721. In some embodiments, additional shell layers with conforming geometries further ensure consistent protection around head 721 and/or promote even distribution of impact forces between layers.

Figure 12:
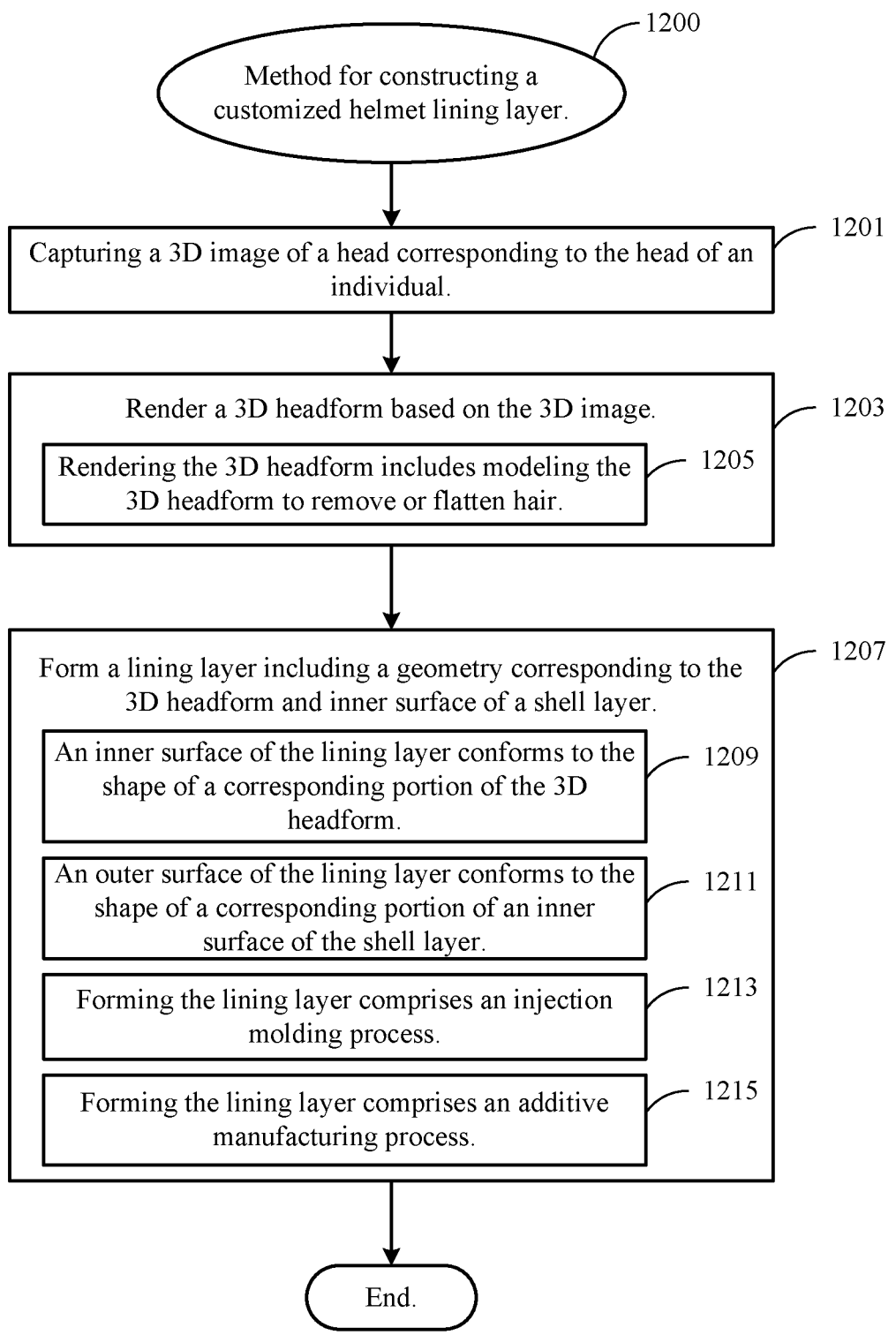
FIG. 12 illustrates another example method for constructing a customized helmet lining layer, in accordance with one or more embodiments.

FIG. 12 illustrates another example method 1200 for constructing a customized helmet lining layer, in accordance with one or more embodiments. At operation 1201 a 3D image of a head corresponding to the head of an individual is captured, such as in step 802. As previously described in step 802, the 3D image may be captured of a head, such as head 721, by one or more of various types of 3D scanners.

At operation 1203 a 3D headform 1205 is rendered based on the 3D image, such as in step 804. In some embodiments 3D headform 1205 is 3D headform 900. In some embodiments, 3D headform 1205 may be a digital rendering. Alternatively, and or additionally, 3D headform 1205 may be a physical construction based on the captured 3D image and/or digital rendering. In some embodiments, rendering the 3D headform 1205 includes modeling the 3D headform 1205 to remove or flatten hair, as previously described with reference to step 804 in FIG. 8 and to FIG. 9. In some aspects, digital modeling software may be implemented to predict the appearance of the head without hair. In other aspects, a physical 3D headform 1205 that includes hair may be sculpted to reflect a bald head with hair removed. In yet other aspects, a contact 3D scanner may physically measure an individual's head to determine the geometry of the head underneath the hair. Such information may be used in the digital rendering of 3D headform 1205. In some embodiments, a physical 3D headform may be constructed by additive manufacturing based on the hairless digital rendering of 3D headform 1205.

At operation 1207, a lining layer is formed, such as in step 806. In some embodiments, the lining layer is lining layer 713*b*, 1013, and/or 1113. In some embodiments, the lining layer is formed based on the rendered 3D headform 1205. In some embodiments, forming the lining layer comprises an injection molding process 1213. For example, plastic foam material may be injection molded in mold members shaped based on a digital and/or physical rendering of 3D headform 1205. In some embodiments, forming the lining layer comprises an additive manufacturing process 1215. For example, an additive manufacturing process may be implemented to construct the lining layer based on the digital rendering of 3D headform 1205 at operation 1203.

In various embodiments, the formed lining layer includes a geometry corresponding to the 3D headform 1205 and inner surface of a shell layer, such as shell layer 1107. In some embodiments, an inner surface 1209 of the lining layer conforms to the shape of a corresponding portion of 3D headform 1205. In some embodiments, an outer surface 1211 of the lining layer conforms to the shape of a corresponding portion of an inner surface of the shell layer, such as shell layer 1107. Thus, when worn on the headform 1205 or the head corresponding to headform 1205, the lining layer should widely conform to the shape of the head or headform 1205 to significantly reduced or eliminate gaps and/or high pressure areas. This may provide for a more comfortable and secure fit, as well as increased protection from impact.

Figure 13A:
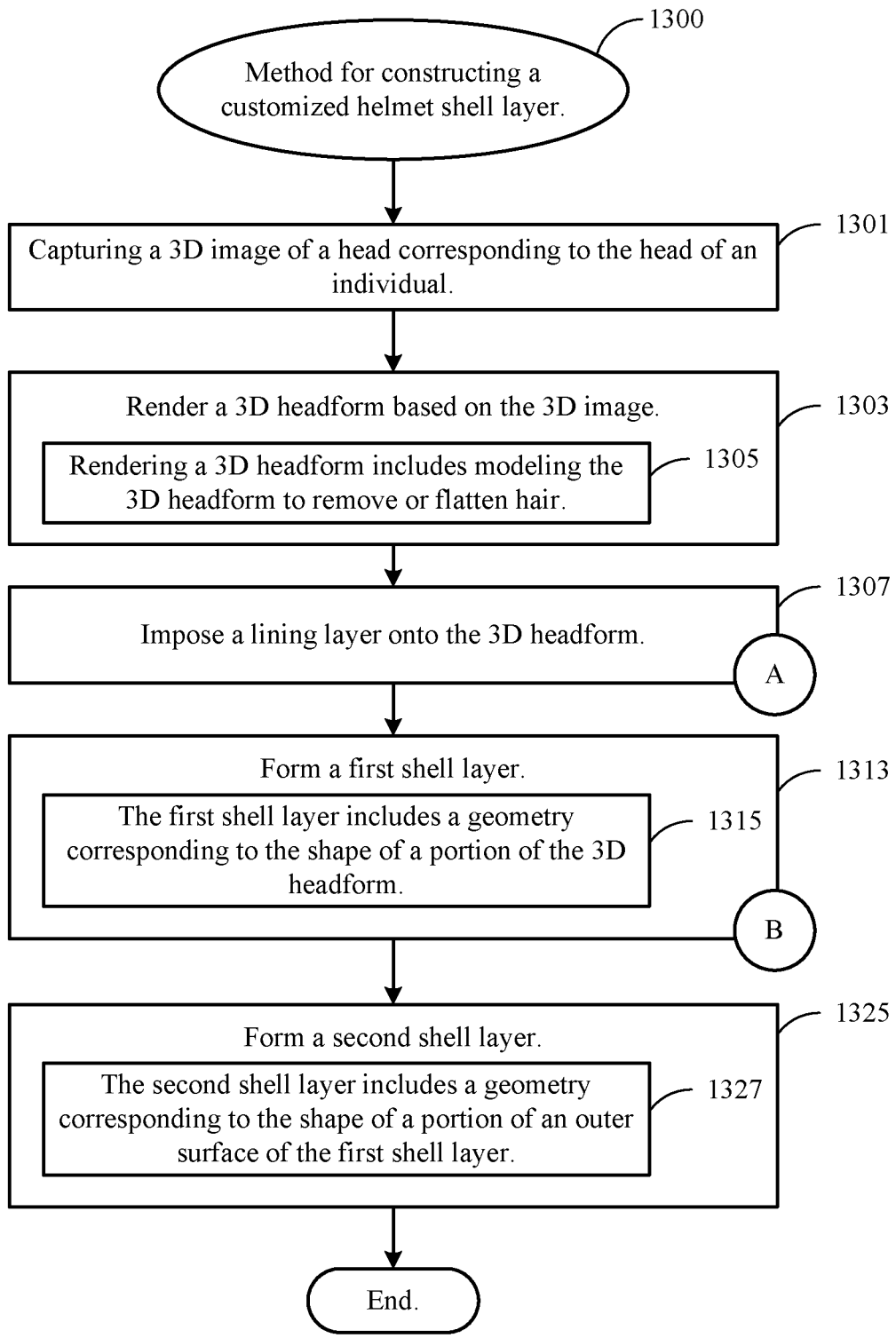
FIGS. 13A and 13B illustrate another example method for constructing a customized helmet shell layer, in accordance with one or more embodiments.
Figure 13B:
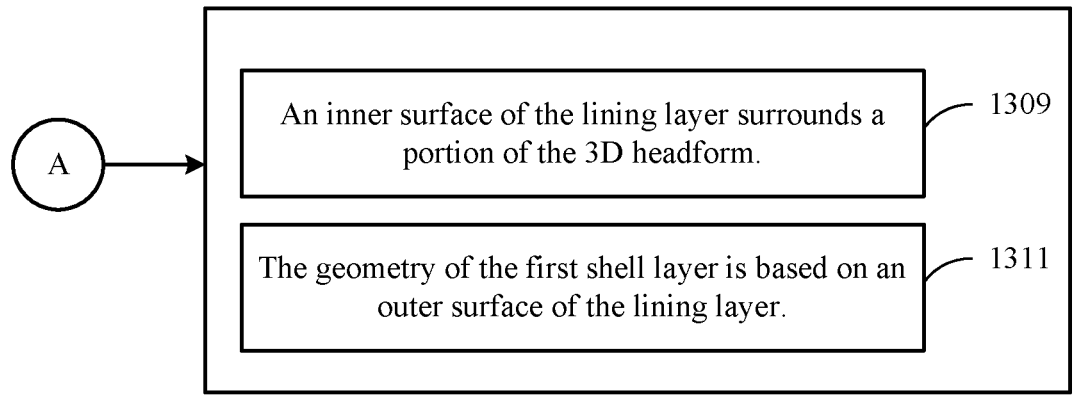
Figure 13B:
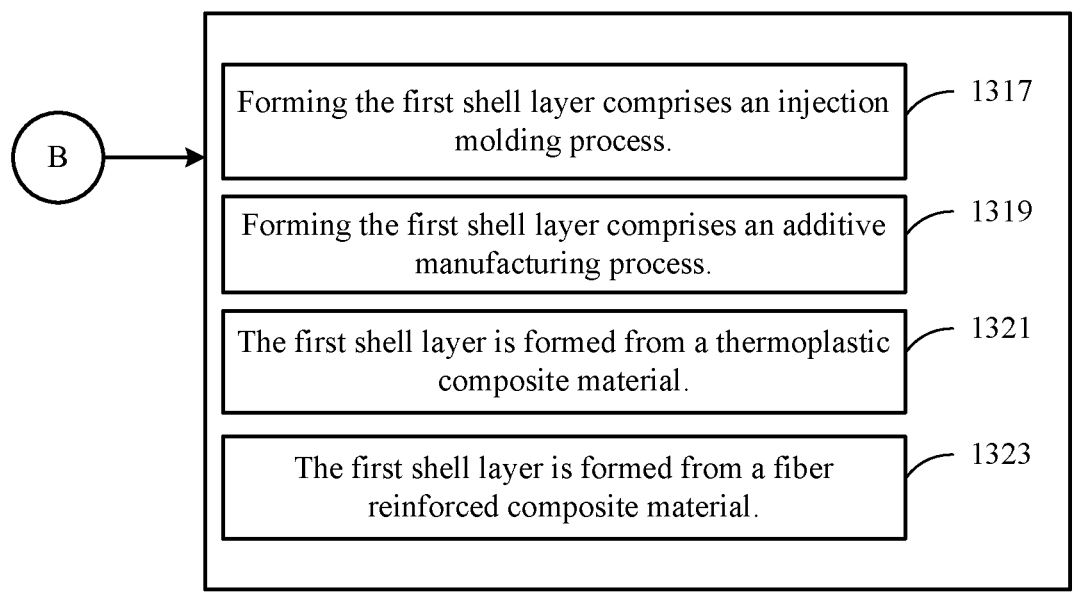

FIGS. 13A and 13B illustratee another example method 1300 for constructing a customized helmet shell layer, in accordance with one or more embodiments. At operation 1301 a 3D image of a head corresponding to the head of an individual is captured, such as in operation 1201 and step 802. At operation 1303, a 3D headform 1305 is rendered based on the 3D image, such as in operation 1203 and step 804. In some embodiments, rendering the 3D headform 1305 includes modeling the 3D headform 1305 to remove or flatten hair, as also previously described in FIGS. 9A and 9B, operation 1203, and step 804.

Operation 1307 is an optional operation in method 1300 that may be implemented to determine the shape of the first shell layer 1315. At operation 1307 a lining layer is imposed onto the 3D headform 1305 rendered at step 1303, such as previously described with reference to step 808. An inner surface 1309 of the lining layer surrounds a portion of the 3D headform 1305. In some embodiments, the geometry of the first shell layer 1315 is based on an outer surface 1311 of the lining layer. In some embodiments, the outer surface 1311 of the lining layer also includes a geometry corresponding to the shape of head 721.

At operation 1313, a first shell layer 1315 is formed, such as in step 808. In some embodiments, the first shell layer 1315 is inner shell layer 1007 and/or 1107. The first shell layer 1315 includes a geometry corresponding to the shape of a portion of the 3D headform 1305. In some embodiments, the geometry of the first shell layer 1315 corresponds to the geometry of the lining layer imposed on the headform 1305 at operation 1307. In some embodiments, forming the first shell layer 1315 comprises an injection molding process 1317. In some embodiments, the first shell layer 1315 is formed from a thermoplastic composite material 1321. For example, a thermoplastic composite material may be injection molded in mold members shaped based on a digital and/or physical rendering of 3D headform 1305.

In some embodiments, forming the first shell layer 1315 comprises an additive manufacturing process 1319. In some embodiments, the first shell layer is formed from a fiber reinforced composite material 1323. In other embodiments, thermoplastic composite materials may be used in such additive manufacturing process. For example, an additive manufacturing process may be implemented to construct the lining layer based on the digital rendering of 3D headform 1305 from operation 1303.

In some embodiments, a helmet, such as helmet 1100 may include additional shell layers. At operation 1325, a second shell layer 1327 may be formed. In some embodiments, the second shell layer 1327 is middle shell layer 1111. The second shell layer 1327 includes a geometry corresponding to the shape of a portion of an outer surface of the first shell layer 1315. For example, the middle shell layer 1111 (second shell layer 1327) may be coupled to inner shell layer 1107 (first shell layer 1315) through an energy and impact transformer 1109. As previously described, multiple shell layers with conforming geometries may cause impact forces to distribute more evenly between the shell layers, such as through energy and impact transformers. In some embodiments, additional shell layers with conforming geometries further ensure consistent protection around head 721 and/or promote even distribution of impact forces between layers.

Although the foregoing invention has been described in some detail for purposes of clarity of understanding, it will be apparent that certain changes and modifications may be practiced within the scope of the appended claims. Therefore, the present embodiments are to be considered as illustrative and not restrictive and the invention is not to be limited to the details given herein, but may be modified within the scope and equivalents of the appended claims.

What is claimed is:

1. A method comprising:
  capturing a 3D image of a head corresponding to the head of a particular user;
  rendering a digital 3D headform based on the captured 3D image;
  modeling the digital 3D headform to remove or flatten hair on the digital 3D headform;
  forming a shell layer including a first geometry such that the shape of an inner surface of the shell layer corresponds to the shape of a corresponding portion of the digital 3D headform; and
  forming a lining layer including a substantially uniform thickness, wherein the lining layer comprises a second geometry corresponding to the digital 3D headform and the inner surface of the shell layer such that:
    an inner surface of the lining layer conforms to the shape of the corresponding portion of the digital 3D headform, and an outer surface of the lining layer conforms to the shape of a corresponding portion of the inner surface of the shell layer.

2. The method of claim 1, wherein forming the lining layer comprises an injection molding process.

3. The method of claim 1, wherein forming the lining layer comprises an additive manufacturing process.

4. A method comprising:
capturing a 3D image of a head corresponding to the head of a particular user;
rendering a digital 3D headform based on the 3D image;
modeling the digital 3D headform to remove or flatten hair on the digital 3D headform;
forming a physical 3D headform corresponding to at least a portion of the digital 3D headform;
layering the physical 3D headform with a proxy lining of substantially uniform thickness such that an outer surface of the proxy lining corresponds to the shape of a corresponding portion of the physical 3D headform;
forming a first shell layer upon the proxy lining to include a first geometry such that the shape of an inner surface of the first shell layer conforms to the shape of a corresponding portion of the outer surface of the proxy lining; and
forming a lining layer with substantially uniform thickness, wherein the lining layer comprises a second geometry corresponding to the physical 3D headform and the inner surface of the first shell layer such that:
an inner surface of the lining layer conforms to the shape of the corresponding portion of the physical 3D headform, and
an outer surface of the lining layer conforms to the shape of a corresponding portion of the inner surface of the first shell layer.

5. The method of claim 4, wherein forming the first shell layer comprises an injection molding process.

6. The method of claim 4, wherein forming the first shell layer comprises an additive manufacturing process.

7. The method of claim 4, wherein the first shell layer is formed from a thermoplastic composite material.

8. The method of claim 4, wherein the first shell layer is formed from a fiber reinforced composite material.

9. The method of claim 4 further comprising forming a second shell layer such that the second shell layer includes a geometry corresponding to the shape of a portion of an outer surface of the first shell layer.

10. A helmet comprising:
a first shell layer, wherein the first shell layer is constructed by:
capturing a 3D image of a head corresponding to the head of a particular user;
rendering a digital 3D headform based on the 3D image;
modeling the digital 3D headform to remove or flatten hair on the digital 3D headform; and
forming the first shell layer to include a first Geometry such that the shape of an inner surface of the first shell layer corresponds to the shape of a corresponding portion of the digital 3D headform; and
a lining layer coupled to the inner surface of the first shell layer, wherein the lining layer includes a substantially uniform thickness and comprises a second geometry corresponding to the digital 3D headform and the inner surface of the first shell layer such that:
an inner surface of the lining layer conforms to the shape of the corresponding portion of the digital 3D headform, and
an outer surface of the lining layer conforms to the shape of a corresponding portion of the inner surface of the first shell layer.

11. The helmet of claim 10, wherein forming the lining layer comprises an injection molding process.

12. The helmet of claim 10, wherein forming the lining layer comprises an additive manufacturing process.

13. The helmet of claim 10, wherein an inner surface of the first shell layer includes a geometry corresponding to the shape of a portion of an outer surface of the lining layer.

14. The helmet of claim 10 further comprising a second shell layer coupled to the first shell layer.

15. The helmet of claim 14 wherein an inner surface of the second shell layer includes a geometry corresponding to the shape of a portion of an outer surface of the first shell layer.

16. The helmet of claim 14 wherein the second shell layer is coupled to the first shell layer through a shear mechanism allowing the second shell layer to slide relative to the first shell layer, wherein the shear mechanism includes an energy transformer having an absorptive/dissipative material.

* * * * *